US012720949B2

(12) United States Patent
Kim et al.

(10) Patent No.: US 12,720,949 B2
(45) Date of Patent: Aug. 25, 2026

(54) LIGHT EMITTING DEVICE, LIGHT EMITTING DISPLAY DEVICE INCLUDING SAME, AND METHOD OF MANUFACTURING SAME

(71) Applicants: LG Display Co., Ltd., Seoul (KR); POSTECH Research and Business Development Foundation, Pohang-si (KR)

(72) Inventors: Kwang Jong Kim, Paju-si (KR); Mi Kyung Park, Paju-si (KR); Sun Kap Kwon, Paju-si (KR); Gi Seong Ryu, Pohang-si (KR); Yong Young Noh, Pohang-si (KR)

(73) Assignees: LG DISPLAY CO., LTD., Seoul (KR); POSTECH RESEARCH AND BUSINESS DEVELOPMENT FOUNDATION, Pohang-si (KR)

(*) Notice: Subject to any disclaimer, the term of this patent is extended or adjusted under 35 U.S.C. 154(b) by 434 days.

(21) Appl. No.: 18/529,524

(22) Filed: Dec. 5, 2023

(65) Prior Publication Data

US 2024/0260299 A1 Aug. 1, 2024

(30) Foreign Application Priority Data

Jan. 30, 2023 (KR) ........................ 10-2023-0012183

(51) Int. Cl.
*H10K 50/155* (2023.01)
*H10K 59/12* (2023.01)

(52) U.S. Cl.
CPC ....... *H10K 50/155* (2023.02); *H10K 59/1201* (2023.02)

(58) Field of Classification Search
CPC ............................. H10K 50/155; H10K 71/30
See application file for complete search history.

(56) References Cited

U.S. PATENT DOCUMENTS

| | | | | |
|---|---|---|---|---|
| 2022/0123250 A1* | 4/2022 | Kim | ..................... | H10K 50/155 |
| 2022/0149310 A1* | 5/2022 | Kim | ..................... | H10K 59/32 |

FOREIGN PATENT DOCUMENTS

| | | | |
|---|---|---|---|
| CN | 114122272 | A | 3/2022 |
| KR | 10-2016-0029099 | A | 3/2016 |
| KR | 10-2020-0111101 | A | 9/2020 |
| KR | 10-2283435 | B1 | 7/2021 |
| KR | 10-2022-0097068 | A | 7/2022 |
| KR | 10-2419061 | B1 | 7/2022 |
| KR | 10-2022-0141236 | A | 10/2022 |
| KR | 10-2535149 | B1 | 5/2023 |

* cited by examiner

*Primary Examiner* — Benjamin P Sandvik
(74) *Attorney, Agent, or Firm* — Birch, Stewart, Kolasch & Birch, LLP

(57) ABSTRACT

Discussed is a light emitting device including a first electrode and a second electrode facing each other, a hole transport layer, a first emission layer, and an electron transport layer sequentially disposed between the first electrode and the second electrode. In the transport layer, a first material of a metal halide and a second material of an n-type inorganic compound are included. The second material is included as a dopant in the first material. The hole transport layer can contain no organic material and can be amorphous.

21 Claims, 18 Drawing Sheets

LIGHT EMITTING DEVICE, LIGHT EMITTING DISPLAY DEVICE INCLUDING SAME, AND METHOD OF MANUFACTURING SAME

CROSS-REFERENCE TO RELATED APPLICATIONS

This application claims priority to Korean Patent Application No. 10-2023-0012183, filed in the Republic of Korea on Jan. 30, 2023, the entire disclosure of which is hereby expressly incorporated by reference into the present application.

BACKGROUND OF THE DISCLOSURE

Field

The present disclosure relates to a light emitting device, and more particularly to a light emitting device including a hole transport layer made of an inorganic material and having high transparency and high conductivity, a light emitting display device including the same, and a method of manufacturing the same.

Discussion of the Related Art

Since entry into a full-fledged information age, the field of displays used to visually represent electrical information signals has developed rapidly, and accordingly, various display devices having excellent performance has been developed to provide various functionalities such as slimness, light weight, and low power consumption.

Among such display devices with excellent performances, a light emitting display device that does not require a separate light source, but has a light emitting device formed within a display panel is being considered as a competitive application since such a display panel is compact and provides vivid colors.

A light emitting device includes a first electrode and a second electrode facing each other as electrodes, and an emission layer and functional layers for carrier transport between the first and second electrodes.

SUMMARY OF THE DISCLOSURE

The functional layers of the light emitting device include a hole transport layer for hole transport. The hole transport layer requires mobility at a predetermined level or more for electrical mobility of a light emitting device, but is limited in mobility when formed of an organic material.

Hence, research into formation of a hole transport layer using an inorganic material having high mobility is ongoing.

Accordingly, the present disclosure is directed to a light emitting device, a light emitting display device including the same, and a method of manufacturing the same that substantially obviate one or more problems due to limitations and disadvantages of the related art.

The present disclosure provides a light emitting device capable of overcoming the mobility limit of a hole transport layer made of an organic material, preventing lateral leakage current by adjusting a doping material in the hole transport layer, and ensuring high transparency and stability by changing the manufacturing process, a light emitting display device including the same, and a method of manufacturing the same.

Additional advantages, objects, and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these objects and other advantages and in accordance with the purpose of the disclosure, as embodied and broadly described herein, a light emitting device according to an embodiment of the present disclosure includes a first electrode and a second electrode facing each other, and a hole transport layer, a first emission layer, and an electron transport layer sequentially disposed between the first electrode and the second electrode, in which the hole transport layer is configured such that a first material of a metal halide is doped with a second material of an n-type inorganic compound.

The hole transport layer can contain no organic material and can be amorphous.

Further, the hole transport layer can have high transparency and high electrical conductivity.

It is to be understood that both the foregoing general description and the following detailed description of the present disclosure are by example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
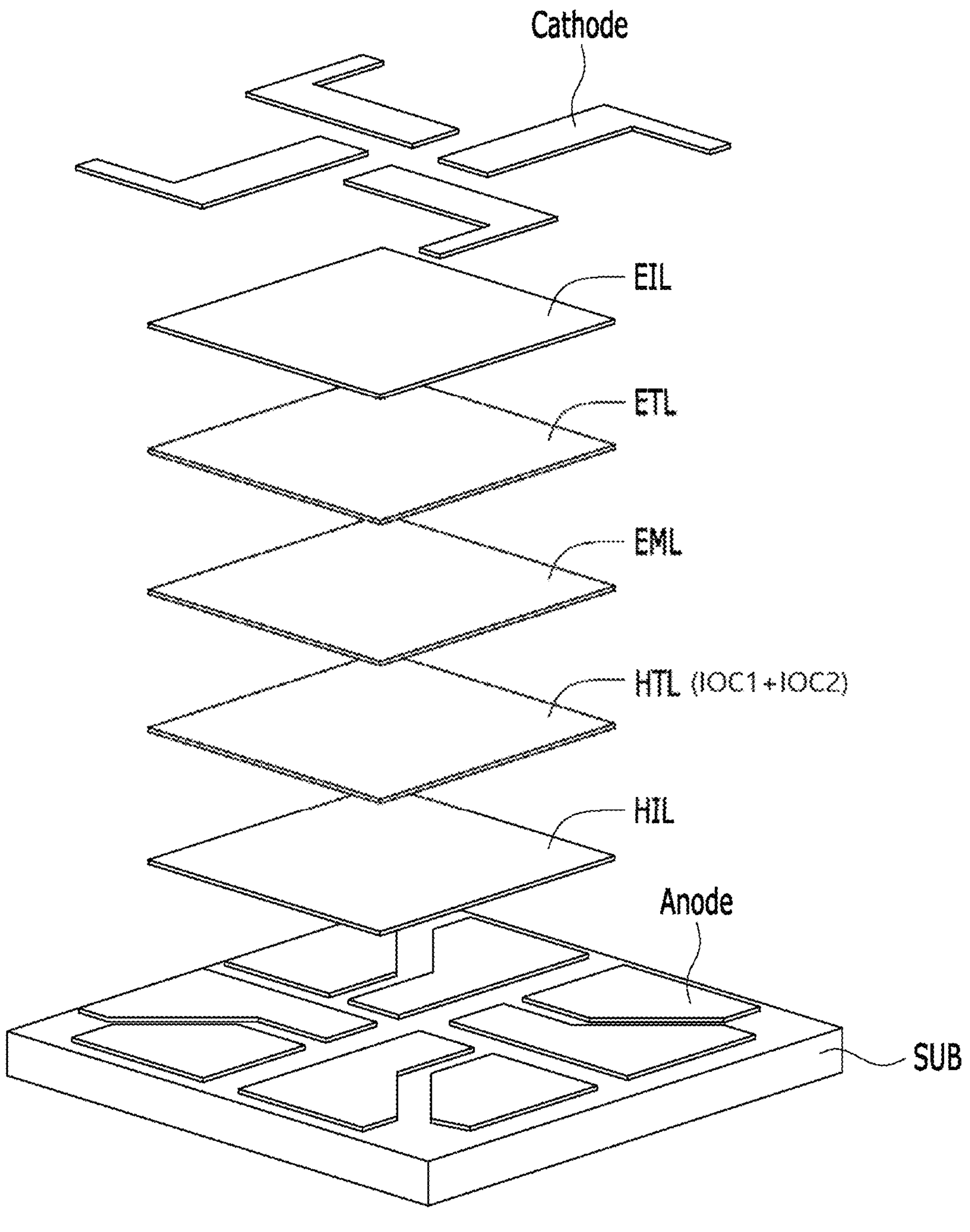
FIG. 1 is an exploded perspective view showing a light emitting device according to an embodiment of the present disclosure.

Reference will now be made in detail to the example embodiments of the present invention, examples of which are illustrated in the accompanying drawings. Wherever possible, the same reference numbers will be used throughout the drawings to refer to the same or like parts. In the following description of the present invention, detailed descriptions of known functions and configurations incorporated herein will be omitted when the same can obscure the subject matter of the present invention. In addition, the names of elements used in the following description are selected in consideration of clear description of the specification, and can differ from the names of elements of actual products.

The shape, size, ratio, angle, number, and the like shown in the drawings to illustrate various embodiments of the present invention are merely provided for illustration, and are not limited to the content shown in the drawings. Wherever possible, the same reference numbers will be used throughout the drawings to refer to the same or like parts. In the following description, detailed descriptions of technologies or configurations related to the present invention can be omitted so as to avoid unnecessarily obscuring the subject matter of the present invention. When terms such as "including", "having", and "comprising" are used throughout the specification, an additional component can be present, unless "only" is used. A component described in a singular form encompasses a plurality thereof unless particularly stated otherwise.

The components included in the embodiments of the present invention should be interpreted to include an error range, even if there is no additional particular description thereof.

In describing a variety of embodiments of the present invention, when terms for positional relationships such as "on", "above", "under" and "next to" are used, at least one intervening element can be present between two elements, unless "immediately" or "directly" is used.

In describing a variety of embodiments of the present invention, when terms related to temporal relationships, such as "after", "subsequently", "next" and "before", are used, the non-continuous case can be included, unless "immediately" or "directly" is used.

In describing a variety of embodiments of the present invention, terms such as "first" and "second" can be used to describe a variety of components, but these terms only aim to distinguish the same or similar components from one another. Accordingly, throughout the specification, a "first" component can be the same as a "second" component within the technical concept of the present invention, unless specifically mentioned otherwise.

Features of various embodiments of the present disclosure can be partially or completely coupled to or combined with each other, and can be variously inter-operated with each other and driven technically. The embodiments of the present disclosure can be carried out independently from each other, or can be carried out together in an interrelated manner.

As used herein, the term "doped" means that, in a material that occupies most of the weight ratio of a layer, a material (for example, N-type and P-type materials, or organic and inorganic substances) having physical properties different from the material that occupies most of the weight ratio of the layer is added in an amount of less than 30% by weight. In other words, the "doped" layer refers to a layer that is used to distinguish a host material from a dopant material of a certain layer, in consideration of the specific gravity of the weight ratio. Further, the term "undoped" refers to any case other than a "doped" case. For example, when a layer contains a single material or a mixture of materials having the same properties as each other, the layer is included in the "undoped" layer. For example, if at least one of the materials constituting a certain layer is p-type and not all materials constituting the layer are n-type, the layer is included in the "undoped" layer. For example, if at least one of materials constituting a layer is an organic material and not all materials constituting the layer are inorganic materials, the layer is included in the "undoped" layer. For example, when all materials constituting a certain layer are organic materials, at least one of the materials constituting the layer is n-type and the other is p-type, when the n-type material is present in an amount of less than 30 wt %, or when the p-type material is present in an amount of less than 30 wt %, the layer is considered a "doped" layer.

Meanwhile, in this specification, an electroluminescence (EL) spectrum is calculated via the product of (1) a photoluminescence (PL) spectrum that represents unique properties of an emissive material such as a dopant or host material included in an organic emissive layer and (2) an outcoupling emittance spectrum curve determined depending on the structure and optical properties of an organic light-emitting device including thicknesses of organic layers such as an electron transport layer.

Hereinafter, a description will be given of example embodiments of the present disclosure with reference to the accompanying drawings. All components of each light emitting device according to all embodiments of the present disclosure are operatively coupled and configured.

FIG. 1 is an exploded perspective view showing a light emitting device according to an embodiment of the present disclosure.

As shown in FIG. 1, the light emitting device according to an embodiment of the present disclosure includes a first electrode Anode and a second electrode Cathode facing each other on a substrate SUB, and a hole transport layer HTL, a first emission layer EML, and an electron transport layer ETL, which are sequentially disposed between the first electrode Anode and the second electrode Cathode. But embodiments of the present disclosure are not limited thereto, and other functional layers can be included in the light emitting device.

The substrate SUB can be, for example, glass or a flexible plastic film. But embodiments of the present disclosure are not limited thereto, as the substrate SUB can include other materials, such as metals.

The first electrode Anode and the second electrode Cathode are also referred to as an anode and a cathode, respectively. The first electrode Anode is also referred to as a pixel electrode in the sense that independent operation for each sub-pixel is possible because it is divided and provided for each sub-pixel on the substrate SUB, and the second electrode Cathode is also referred to as a common electrode in the sense that it is provided in common to a plurality of sub-pixels. The first electrode Anode can also be referred to as a first electrode, and the second electrode Cathode can also be referred to as a second electrode.

FIG. 1 shows an example in which one second electrode Cathode is provided to correspond to every two first electrodes Anode, but the light emitting device according to an embodiment of the present disclosure is not limited thereto, and the second electrode Cathode can be provided in an integral form for all sub-pixels provided on the substrate SUB.

A hole injection layer HIL can be further included between the first electrode Anode and the hole transport layer HTL. In some cases, the hole injection layer HIL can be omitted, or can be combined with the hole transport layer HTL and be provided as a combined layer.

In the light emitting device according to an embodiment of the present disclosure, the hole transport layer HTL includes a metal halide as a main material or a first material IOC1. Further, the hole transport layer HTL further includes an n-type inorganic compound as a secondary material or a second material IOC2 in a smaller amount than the amount of the first material IOC1. The n-type inorganic compound serves as a dopant and has a polarity opposite to that of the p-type property (hole transport) of a metal halide.

Specifically, the hole transport layer HTL includes a first material IOC1 of a metal halide and a second material IOC2 of an n-type inorganic compound. The first material IOC1 is of p-type and the second material IOC2 is of n-type. Compared to the first material IOC1, the second material IOC2 is included in a small amount as a dopant, so that high hole mobility of the first material IOC1 is adjusted so as to be suitable for the carrier movement speed of the other layer. In various embodiments of the present disclosure, the first material IOC1 and the second material IOC2 can have opposite polarity, but embodiments of the present disclosure are not limited thereto.

Both the metal halide and the n-type inorganic compound are inorganic materials, and both the first and second materials IOC1, IOC2 are inorganic materials, and thus the hole transport layer HTL of the light emitting device according to the present disclosure can be composed exclusively of inorganic materials. Further, the second material IOC2 can be a metal halide, but is not limited thereto, and any inorganic compound having n-type properties can be used. However, the second material IOC2 used for the light emitting device according to the present disclosure can be selected from among materials that decrease surface roughness without reducing transparency when included along with the first material IOC1 of metal halide in the hole transport layer.

Further, the metal halide constituting the first material IOC1 of the hole transport layer HTL is a p-type inorganic semiconductor material, which transfers holes from the first electrode Anode to the emission layer EML. Among p-type inorganic semiconductor materials, the metal halide used as the first material IOC1 of the hole transport layer in the light emitting device according to the present disclosure is a compound of a metal and halogen or an element of a halogen group. An example of the first material IOC1 can include copper iodide (CuI).

The first material IOC1 used in the hole transport layer of the light emitting device according to the present disclosure has hole mobility tens to thousands of times higher than that of a known hole transport material including an organic material containing an aryl group. The high hole mobility of the first material IOC1 means that hole mobility can be attained at a predetermined level or more even when the thickness of the hole transport layer is increased. In particular, a light emitting device in which a hole transport layer is formed using a p-type inorganic semiconductor material having high electrical mobility as a main material is advantageous for a large-area process by widening a process window when applied to a large-area light emitting display device.

Moreover, when a p-type inorganic semiconductor material having high electrical mobility is included as a main material in the hole transport layer, in a device that controls microcavity effects by varying the thicknesses of the hole transport layer and a hole transport compensation layer for each sub-pixel, it is possible to obtain hole mobility of a predetermined level or more even at high thickness, resulting in effective electrical characteristics of the light emitting device. The hole transport compensation layer may comprise the same material as the hole transport layer.

Further, the p-type inorganic semiconductor material has processing stability due to inorganic material properties, and can be less volatile than organic semiconductor materials.

CuI (copper iodide), which is exemplified as the first material IOC1 included in the hole transport layer, is a material having an energy band gap of about 3 eV or more and has high transparency in the visible light range. Further, CuI has a HOMO (highest occupied molecular orbital) energy level between a hole injection layer material of a known organic compound and an emission layer material of an organic compound. In the light emitting device according to an embodiment of the present disclosure, when the first material IOC1 having a HOMO energy level between the HOMO energy level of the hole injection layer and the HOMO energy level of the emission layer is provided, even though all other layers HIL, EML, ETL, EIL between the first and second electrodes Anode, Cathode are made of organic compound materials, holes injected into the hole injection layer HIL can be transferred to the emission layer EML made of a known organic compound material through the hole transport layer HTL without high resistance at each interface. Specifically, the HOMO energy level of the metal halide, which is the first material of the hole transport layer, can be equal to or lower than the HOMO energy level of the hole injection layer, and can be equal to or higher than the HOMO energy level of the emission layer (mainly the host).

In the light emitting device according to the present disclosure, the second material IOC2 included in the hole transport layer can contain the same halogen group element as the halogen group element included in the first material IOC1 described above. Examples of the halogen group element can include fluorine (F), chlorine (Cl), bromine (Br), iodine (I), astatine (At), and the like. But embodiments of the present disclosure are not limited thereto. When the first material IOC1 and the second material IOC2 include the same halogen group element, even though the first and second materials IOC1, IOC2 are dissociated and divided into metal cations and a halogen group element in the hole transport layer HTL, physical and chemical properties of the hole transport layer are not changed, and electrical and optical properties are maintained in a state in which the hole transport layer is deposited and annealed.

Meanwhile, the second material IOC2 is a compound of a halogen or an element of a halogen group and a metal, and the metal coupled with the halogen or an element of a halogen group can be at least one selected from among an alkali metal, an alkaline earth metal, a transition metal, and a post-transition metal. But embodiments of the present disclosure are not limited thereto. In various embodiments of the present disclosure, the second material IOC2 can be a metal halide.

For example, the metal included in the second material IOC2 can be at least one selected from among Bi (bismuth), Cs (cesium), Rb (rubidium), Zn (zinc), Ni (nickel), Ga (gallium), Sn (tin), and Sb (antimony). Other materials or metal can also be used.

Further, the second material IOC2 can be included in an amount of 0.1 mol % to 15 mol % in the hole transport layer HTL. When approximately converted to a volume ratio, the amount of the second material IOC2 can be 0.276 vol % to 41.4 vol % based on the total volume of the hole transport layer HTL. But embodiments of the present disclosure are not limited thereto, and amount greater than 15 mol %, such as 40 mol % is within the scope of the present disclosure. The significance of the amount of the second material IOC2 is described later.

In the light emitting device according to the present disclosure, the hole transport layer HTL, the emission layer EML, and the electron transport layer ETL can be sequentially provided, and respective sides of the emission layer EML can be in contact with the hole transport layer HTL and the electron transport layer ETL. But embodiments of the present disclosure are not limited thereto, as other functional layers can also be provided.

In some cases, in another embodiment of the present disclosure, an electron blocking layer EBL can be further included between the hole transport layer HTL and the emission layer EML, or a hole blocking layer HBL can be further included between the emission layer EML and the electron transport layer ETL.

Further, an electron injection layer EIL can be further included between the electron transport layer ETL and the second electrode Cathode. The electron injection layer EIL can include a metal dopant or a metal contained in the second electrode Cathode in order to reduce an energy barrier for electron injection at the interface with the second electrode material.

The first electrode Anode and the second electrode Cathode can include either a transparent electrode or a reflective electrode depending on the emission type of the light emitting device. The transparent electrode can be made of a material having a relatively high work function value, such as indium tin oxide (ITO) or indium zinc oxide (IZO). The reflective electrode can be made of a single layer or multiple layers of any one or an alloy thereof selected from the group consisting of silver (Ag), magnesium (Mg), aluminum (Al), copper (Cu), molybdenum (Mo), titanium (Ti), nickel (Ni), chromium (Cr), and tungsten (W). But embodiments of the present disclosure are not limited thereto, and other materials can be included.

In some cases, when the light emitting device is applied to a transparent display device, both the first electrode Anode and the second electrode Cathode can include transparent electrodes.

When the light emitting device is of a bottom emission type, the first electrode Anode can be formed as a transparent electrode and the second electrode Cathode can be formed as a reflective electrode. The transparent electrode constituting the first electrode Anode can be made of a material having a relatively large work function value, such as indium tin oxide (ITO) or indium zinc oxide (IZO). The reflective electrode constituting the second electrode Cathode can be made of a single layer or multiple layers of any one or an alloy thereof selected from the group consisting of silver (Ag), magnesium (Mg), aluminum (Al), copper (Cu), molybdenum (Mo), titanium (Ti), nickel (Ni), chromium (Cr), and tungsten (W). But embodiments of the present disclosure are not limited thereto, and other materials can be included.

When the light emitting device is of a top emission type, the first electrode Anode can include a reflective electrode, and the second electrode Cathode can include a transparent electrode or a trans-reflective electrode. For example, when the first electrode Anode includes a reflective electrode, the first electrode Anode can be formed in a multilayer structure including a transparent conductive film and an opaque conductive film having high reflection efficiency. The transparent conductive film of the first electrode Anode can be made of a material having a relatively large work function value such as indium tin oxide (ITO) or indium zinc oxide (IZO), and the opaque conductive film can be made of a single layer or multiple layers of any one or an alloy thereof selected from the group consisting of silver (Ag), magnesium (Mg), aluminum (Al), copper (Cu), molybdenum (Mo), titanium (Ti), nickel (Ni), chromium (Cr), and tungsten (W). But embodiments of the present disclosure are not limited thereto. For example, the first electrode Anode can be formed in a structure in which a transparent conductive film, an opaque conductive film, and a transparent conductive film are sequentially stacked, or a structure in which a transparent conductive film and an opaque conductive film are sequentially stacked. The first electrode Anode can be exemplified by a stack structure of ITO/Ag/ITO. But embodiments of the present disclosure are not limited thereto.

The second electrode Cathode can be made of a transparent conductive material such as indium tin oxide (ITO) or indium zinc oxide (IZO), and can be made of silver (Ag), aluminum (Al), magnesium (Mg), calcium (Ca), ytterbium (Yb), or an alloy including at least one thereof, having a low thickness sufficient to transmit light. But embodiments of the present disclosure are not limited thereto. When the second electrode Cathode is made of a metal or metal alloy with a low thickness sufficient to transmit light, the second electrode Cathode has trans-reflectivity, so that light resonated between the first electrode Anode and the second electrode Cathode has strong cavity characteristics and can be transmitted through the second electrode Cathode.

Further, in the light emitting device according to the present disclosure, when both the emission layer EML and the electron transport layer ETL except for the hole transport layer HTL are made of organic compounds, formation of the hole transport layer HTL using a metal halide alone can cause the hole mobility to be much greater than the electron mobility, lowering the recombination rate of holes and electrons in the emission layer EML. Hence, in order to increase the recombination rate of holes and electrons in the emission layer EML and stably form the emission area in the emission layer EML without being biased to the hole transport layer or the electron transport layer by making the hole mobility and the electron mobility similar in the emission layer, a small amount of an n-type semiconductor having a polarity opposite to that of a metal halide (first material) as a p-type semiconductor is included as a dopant (second material) in the hole transport layer for the light emitting device according to the present disclosure.

In the light emitting device according to the present disclosure, the hole transport layer can be formed of an inorganic material alone, making it possible to overcome the mobility limit caused by use of an organic material.

Further, in the light emitting device according to the present disclosure, the hole transport layer can include a first material of a metal halide and a second material of an n-type inorganic compound. The second material having a polarity opposite to that of the first material can be included in the hole transport layer, compensating for a speed difference between a fast supply speed of holes when the first material is used alone in the hole transport layer and a slow supply speed of electrons supplied to the emission layer due to organic materials used for the emission layer and the electron transport layer. Moreover, in the emission layer, generation of the emission area may not be biased to a specific portion and the recombination rate of holes and electrons can be improved.

Further, in the light emitting device according to the present disclosure, the hole transport layer can be formed by subjecting the first material and the second material to co-deposition by vacuum deposition, and thus an organic solvent may not be used for formation of the hole transport layer and the stability and high mobility of the hole transport layer can be maintained.

Further, in the light emitting device according to the present disclosure, high transmittance and high transparency can be obtained even when an inorganic semiconductor is used for the hole transport layer of the light emitting device by performing annealing at a predetermined temperature or higher after deposition of the hole transport layer.

In the light emitting device according to the present disclosure, when the hole transport layer is provided as a common layer in a large-area light emitting display device, high hole mobility of the first material can be adjusted with the second material having a polarity opposite thereto, thus controlling the mobility in a horizontal direction and preventing or reducing lateral leakage current.

In the light emitting device according to the present disclosure, the hole transport layer can be made of a metal halide and an n-type inorganic semiconductor material, environmental stability of which has been verified, and driving voltage can be reduced due to improved hole mobility of the hole transport layer. Further, the hole transport layer can be formed through a vacuum deposition process like the other functional layers. Therefore, it is possible to lower production energy when forming the hole transport layer and also to reduce use of harmful substances. Accordingly, there is exhibited an ESG (environment/social/governance) effect in view of eco-friendliness, low power consumption, and process optimization.

Although embodiments of the present disclosure are discussed in terms of the first and second materials IOC1, IOC2 being composed exclusively of inorganic materials, the embodiments of the present disclosure are not limited to the hole transport layer HTL being composed exclusively of inorganic materials. For example, in addition to the first and second materials IOC1, IOC2, additional materials can be included in the hole transport layer HTL as a third material IOC3, or additional materials. Further, in other embodiments, organic or inorganic materials can be included in the hole transport layer HTL as a base material or a matrix material of the hole transport layer HTL, and such a base material or a matrix material can further include various material IOC3 being organic or inorganic materials.

Below is a description of electro-optical characteristics of the light emitting device according to the present disclosure as shown in FIG. 1 through the following experiments.

A method of manufacturing the light emitting device in Experimental Examples applied in the following experiments is described.

Experimental Examples

Specifically, as shown in FIG. 1, a glass substrate SUB was prepared, after which a plurality of first electrodes Anode spaced apart from each other was patterned, and cleaning was performed. Subsequently, the substrate SUB including the first electrodes Anode was subjected to surface treatment while supplying ozone (03) gas for 20 minutes or more.

Subsequently, the substrate SUB including the first electrodes Anode was spin-coated with poly(3,4-ethylenedioxythiophene) polystyrene sulfonate (PEDOT:PSS) in an organic solvent and then heat-treated to volatilize the organic solvent, thereby forming a hole injection layer HIL having a thickness of 50 nm.

Subsequently, the substrate SUB was placed in a vacuum chamber connected to a glove box filled with nitrogen, and a hole transport layer was formed using CuI as a first material. Here, the hole transport layer was formed of CuI alone in Experimental Example 1, and RbI, CsI, AgI, $SnI_2$, and $BiI_3$ were used as a second material in addition to the first material (CuI) in Experimental Examples 2 to 6. In Experimental Examples 2 to 6, the first material and 5 mol % of the second material were supplied at a rate of 0.1 nm/sec and co-deposited in a vacuum. The hole transport layer HTL formed in each of Experimental Examples 1 to 6 had a thickness of 40 nm to 80 nm.

Subsequently, the hole transport layer of each of Experimental Examples 1 to 6 was annealed through heat treatment at a temperature of 60° C. to 200° C.

Subsequently, an emission layer EML was formed by subjecting an anthracene-based host and a boron-based dopant having TADF (thermally activated delayed fluorescence) characteristics to vacuum deposition to a thickness of 15 nm.

Subsequently, an electron transport layer ETL was formed by subjecting a TPBi material to vacuum deposition to a thickness of 40 nm.

Subsequently, an electron injection layer EIL was formed by subjecting a LiF material to vacuum deposition to a thickness of 0.87 nm.

Subsequently, a second electrode Cathode having a thickness of 70 nm was formed by sputtering aluminum (Al).

As shown in Table 1 below, respective hole transport layers were formed using the first material and different kinds of second materials in Experimental Examples. In Experimental Example 1, only the first material (CuI) was included in the hole transport layer, and in Experimental Examples 2 to 6, CuI was commonly used as the first material and different kinds of second materials were used.

TABLE 1

| Classification | HTL structure First material | HTL structure Second material | Crystallinity | Root-mean-square roughness (Rq) [nm] |
|---|---|---|---|---|
| Experimental Example 1 | CuI | No | Yes | 4.80 |
| Experimental Example 2 | CuI | RbI | Yes | 9.35 |
| Experimental Example 3 | CuI | CsI | Yes | 2.69 |
| Experimental Example 4 | CuI | AgI | Yes | 2.73 |
| Experimental Example 5 | CuI | $SnI_2$ | Yes | 4.63 |
| Experimental Example 6 | CuI | $BiI_3$ | No | 1.88 |

The characteristics of the light emitting device formed by Experimental Examples are evaluated based on the following experimental results, and the light emitting device according to the present disclosure is reviewed.

Figure 2:
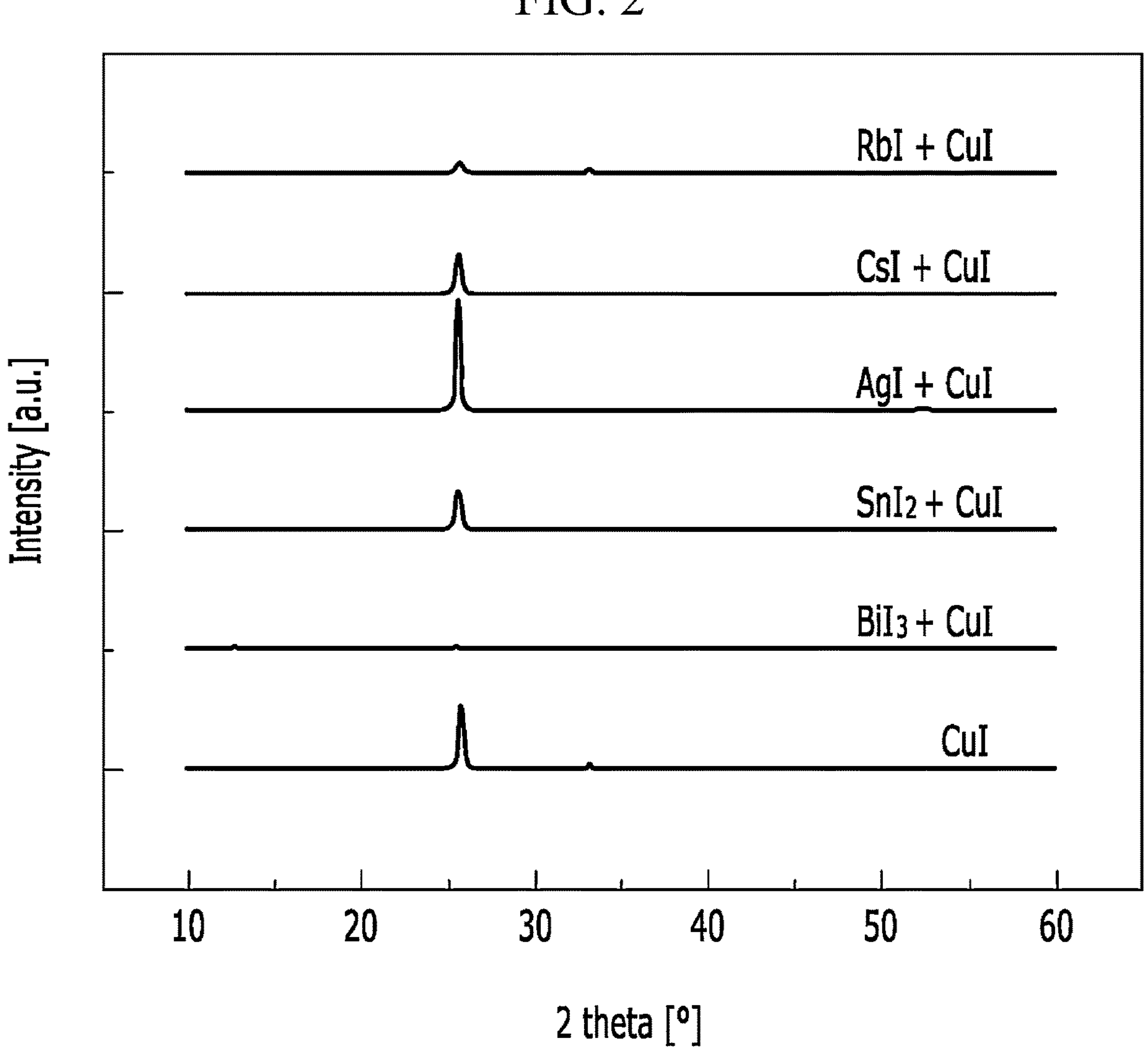
FIG. 2 is a graph showing XRD results after deposition of a metal halide alone and metal halides doped with n-type inorganic compounds in Experimental Examples.

FIG. 2 is a graph showing XRD results after deposition of a metal halide alone and metal halides doped with n-type inorganic compounds in Experimental Examples.

As shown in FIG. 2 and Table 1, based on results of XRD (X-ray diffraction: analysis of diffraction characteristics after X-ray irradiation) of Experimental Example 1 using the first material (CuI) alone and Experimental Examples 2 to 6 in which the first material and different kinds of second materials were co-deposited, there was almost no diffraction after X-ray irradiation in Experimental Example 6 using $BiI_3$ as the second material. In contrast, diffraction occurred in Experimental Examples 1 to 5 although there was a difference in the extent of diffraction after X-ray irradiation. This is deemed to be because the film formed in Experimental Example 6 (CuI+$BiI_3$) has no crystallinity and is almost amorphous. But embodiments of the present disclosure are not limited thereto. When the film is referred to as being almost amorphous, the film can be mostly amorphous and can have crystallinity that is less than a predetermined amount. In various embodiments of the present disclosure, crystallinity can vary, and can range to be 20% or less. In various embodiments of the present disclosure, the film can be over 80% amorphous.

Figure 3:
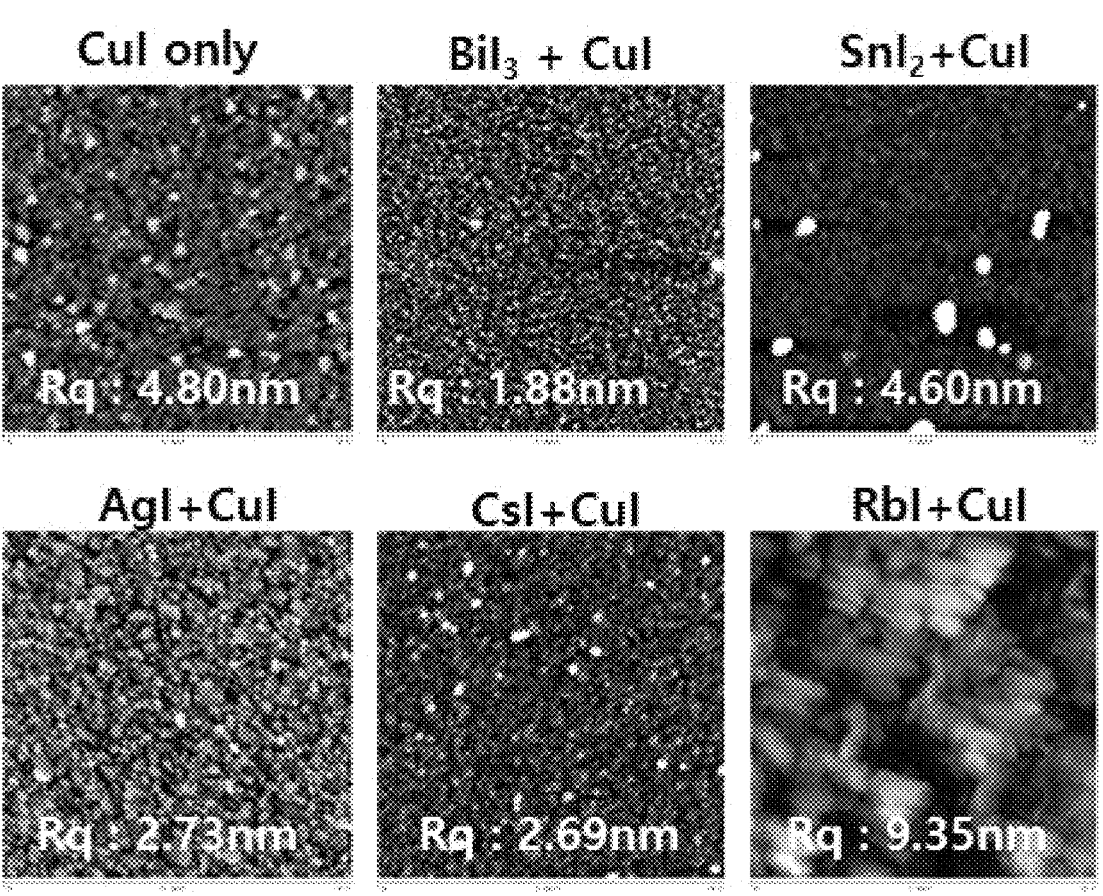
FIG. 3 shows surface AFM images after deposition of a metal halide alone and metal halides doped with n-type inorganic compounds in Experimental Examples.

FIG. 3 shows surface AFM (atomic force microscope) images after deposition of a metal halide alone and metal halides doped with n-type inorganic compounds in Experimental Examples.

As shown in FIG. 3, when observing each surface after formation of the hole transport layer according to Experimental Examples 1 to 6 using a scanning probe microscope, surface roughness gradually increased in the order of Experimental Example 6 (CuI+$BiI_3$), Experimental Example 3 (CuI+CsI), Experimental Example 4 (CuI+AgI), Experimental Example 5 (CuI+$SnI_2$), Experimental Example 1 (CuI), and Experimental Example 2 (CuI+RbI).

As is apparent from the results of FIG. 3, the hole transport layer having almost amorphous surface characteristics was obtained through Experimental Example 6 (CuI+$BiI_3$).

As is apparent from the results of FIG. 3, the roughness diameter in Experimental Example 2 (CuI+RbI) doped with the second material (RbI) was great compared to Experimental Example 1 using only the first material (CuI). Here, the doping amount of the second material (RbI) was 5 mol % in the hole transport layer, indicating that roughness can be reduced with a decrease in the doping amount of the second material (RbI).

Moreover, in Experimental Example 6 (CuI+$BiI_3$) among Experimental Examples above, almost no surface roughness and almost amorphous surface characteristics were obtained when forming the hole transport layer.

However, the light emitting device according to the present disclosure is not limited to Experimental Example 6. As necessary, surface roughness can be controlled by adjusting the doping amount of the second material in the hole transport layer.

In the following experiments, transparency was measured by varying the temperature for post-annealing of the hole transport layer of Experimental Example 6 (CuI+$BiI_3$), which showed the best properties in material combinations for the hole transport layer.

Figure 4:
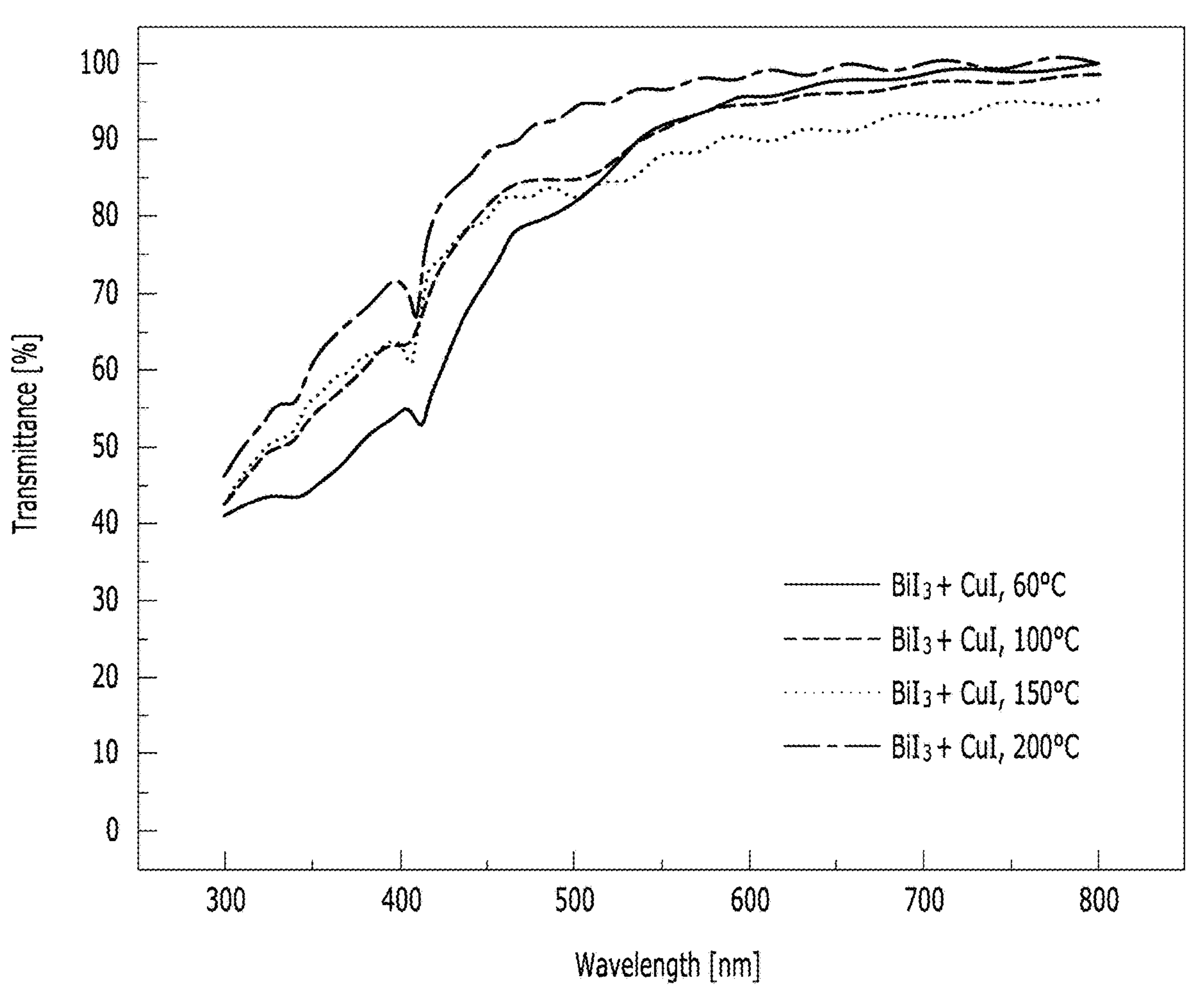
FIG. 4 is a graph showing transmittance at each wavelength depending on the annealing temperature after deposition of a metal halide doped with an n-type inorganic compound in a light emitting device according to an embodiment of the present disclosure.
Figure 5:
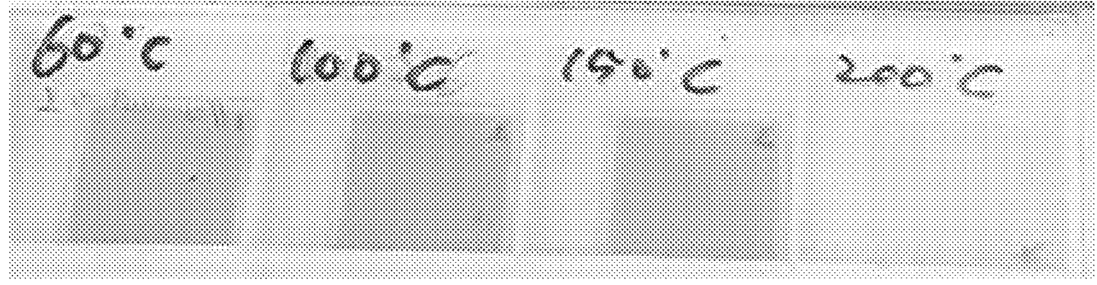
FIG. 5 is a photograph showing samples at different annealing temperatures of FIG. 4.

FIG. 4 is a graph showing transmittance at each wavelength depending on the annealing temperature after deposition of a metal halide doped with an n-type inorganic compound in the light emitting device according to an embodiment of the present disclosure. FIG. 5 is a photograph showing samples at different annealing temperatures of FIG. 4.

For the hole transport layer formed in Experimental Example 6 (CuI+$BiI_3$), annealing was performed for 20 minutes in a glove box at temperatures of 60° C., 100° C., 150° C., and 200° C., and transmittance was measured for each sample through UV-vis.

As shown in FIG. 4, the sample formed in Experimental Example 6 (CuI+$BiI_3$) had a transmittance of 80% or more in the visible light range (420 nm to 700 nm) when annealed at a temperature of 150° C. or more.

Further, as shown in FIG. 4, the sample in which the hole transport layer formed in Experimental Example 6 was subjected to post-annealing at 200° C. or more had a transmittance of 95% or more at a wavelength of 520 nm or more.

In addition, when observing transparency and colorability after treatment at different temperatures as shown in FIG. 5, the sample had almost colorless transparency upon post-annealing at a temperature of 200° C. or more. The transmittance increased from 85% to 95% at a wavelength of 520 nm before and after annealing at 200° C.

Specifically, in the light emitting device according to the present disclosure, transmittance can be increased by forming the hole transport layer through co-deposition of the first material (metal halide) and the second material (n-type inorganic compound) and then performing annealing at a temperature of about 150° C. to 300° C.

FIGS. 6A to 6D are graphs showing results of measurement of transmittance in an initial state and after a predetermined time depending on the post-annealing temperature for the light emitting device according to an embodiment of the present disclosure.

FIGS. 6A to 6D are graphs showing absorbance with time at different temperatures after forming the hole transport layer in Experimental Example 6 described in FIG. 5.

After primary measurement of absorbance, the film was stored in a vacuum chamber (glove box antechamber) at room temperature for about 20 days and then measured again.

Figure 6A:
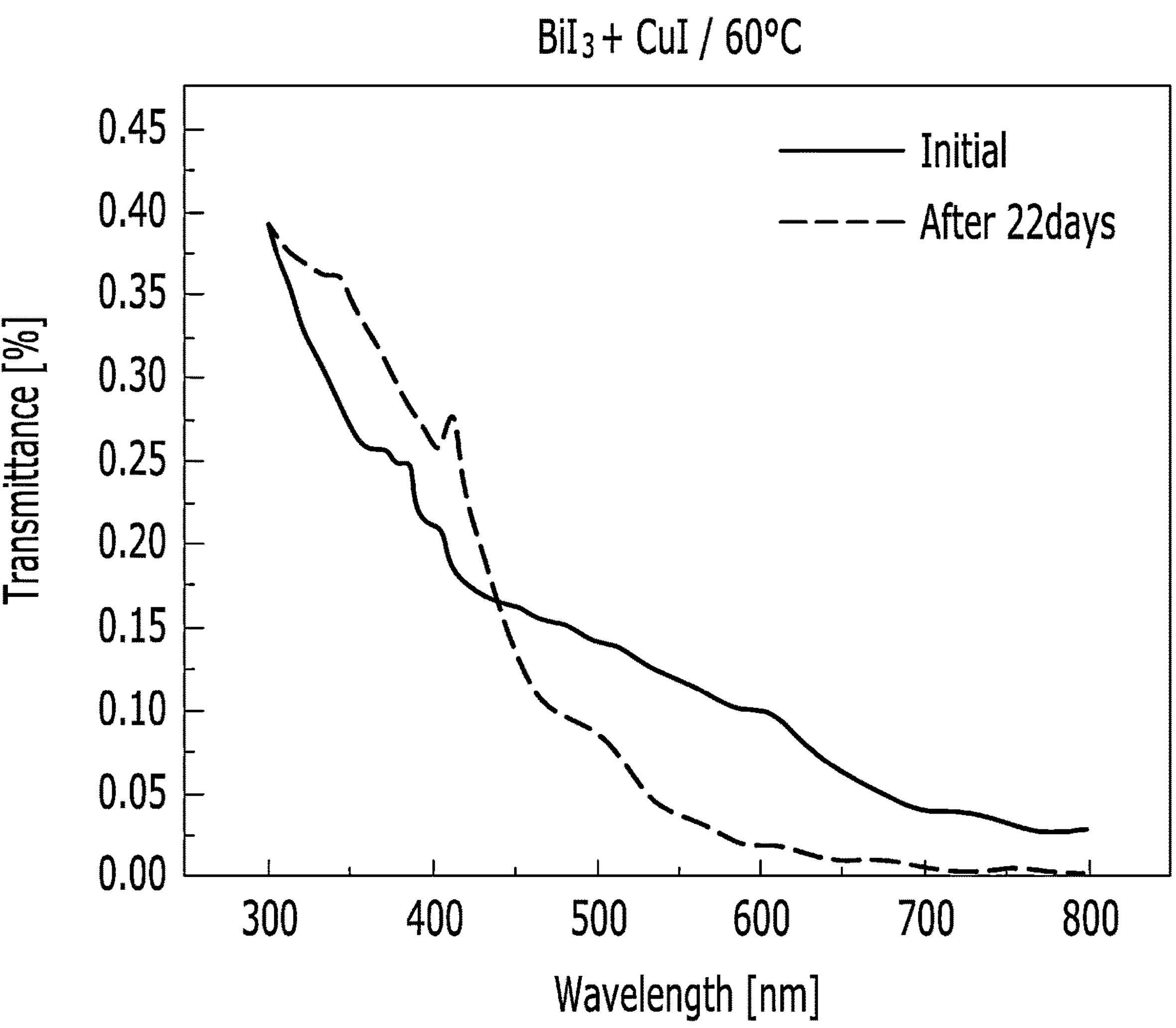
FIGS. 6A to 6D are graphs showing transmittance measured in an initial state and after a predetermined time depending on the post-annealing temperature in the light emitting device according to an embodiment of the present disclosure.
Figure 6B:
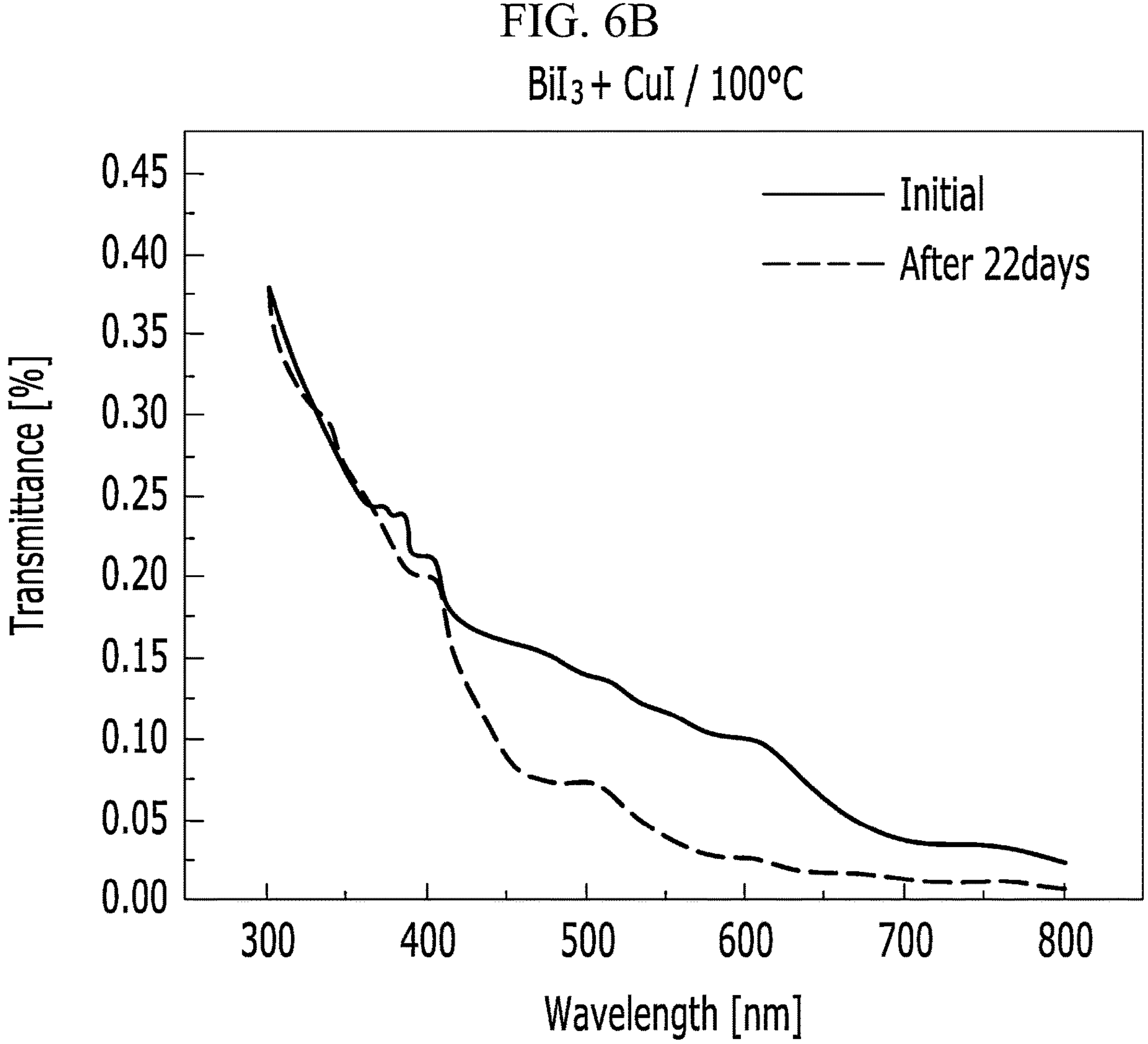
Figure 6C:
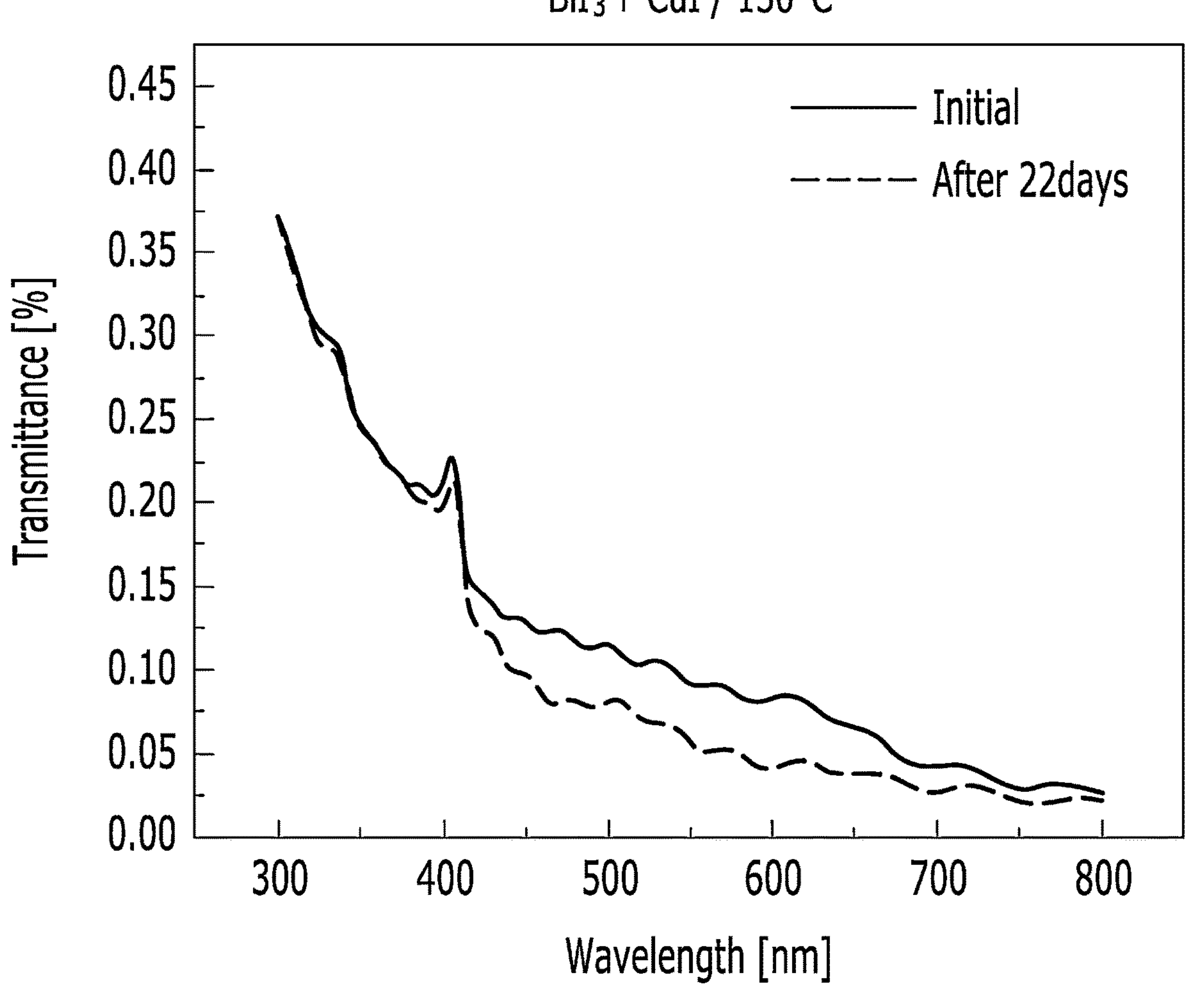
Figure 6D:
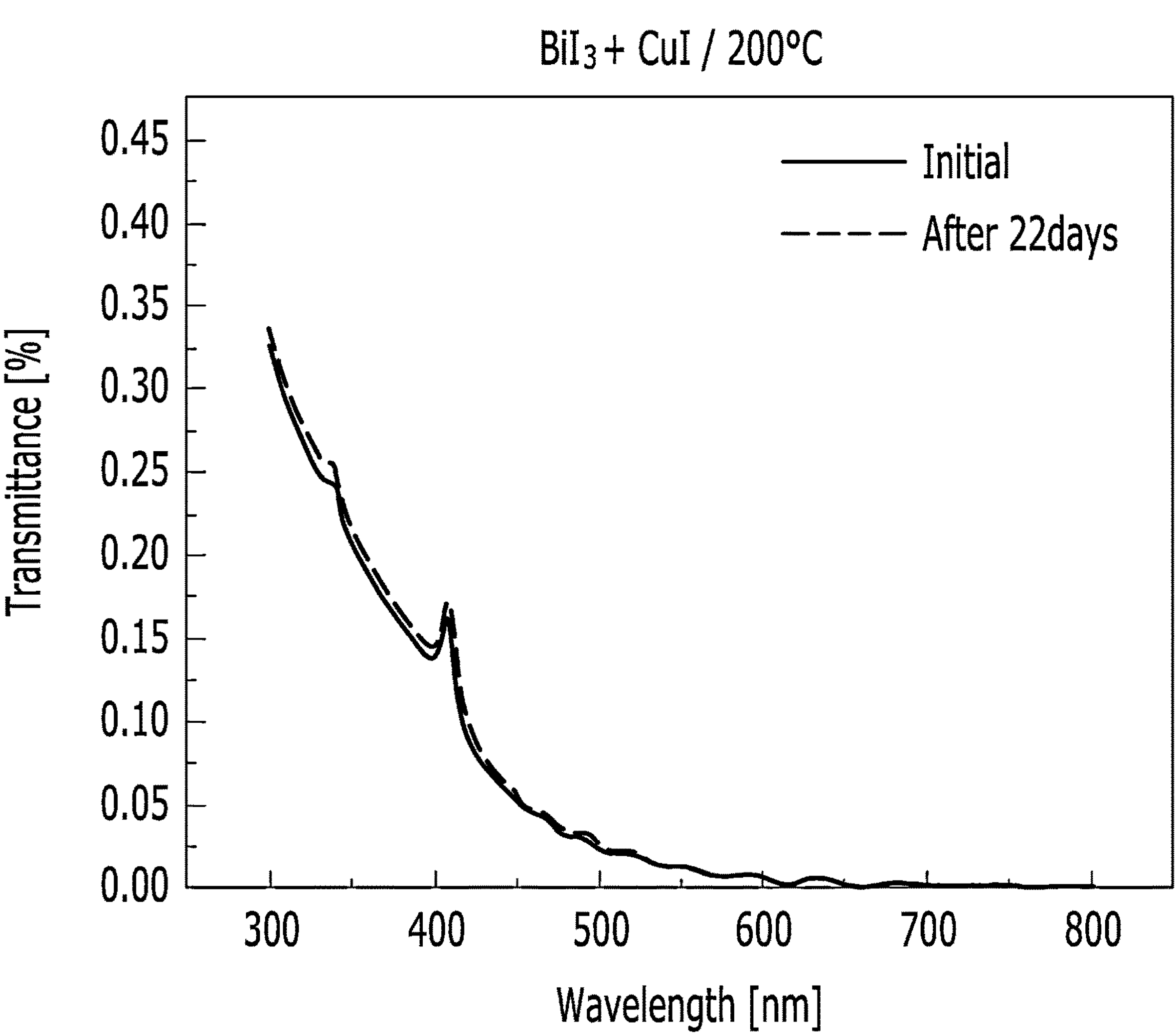

As shown in FIGS. 6A to 6C, absorbance was changed with time when the annealing temperature was 150° C. or less. On the other hand, as shown in FIG. 6D, the annealed device at 200° C. showed almost the same absorbance characteristics as initially, indicating relative stability of the hole transport layer.

Figure 7A:
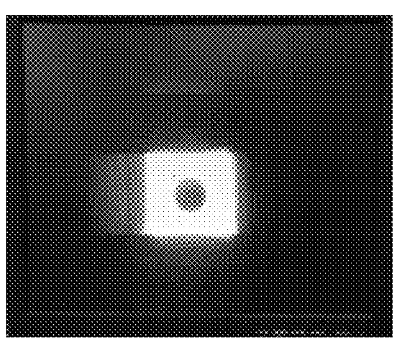
FIG. 7A shows photographs showing a change in characteristics a predetermined time after light emission in a light emitting device, which includes a hole transport layer formed of a metal halide doped with an n-type inorganic compound and in which post-annealing is not performed.
Figure 7A:
Figure 7A:
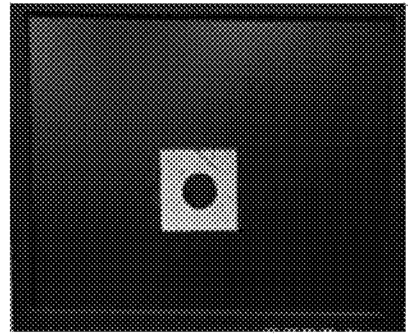
Figure 7B:
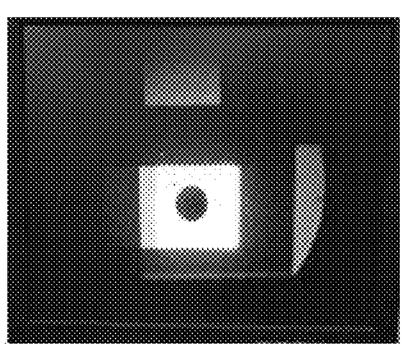
FIG. 7B shows photographs showing a change in characteristics a predetermined time after light emission in a light emitting device, which includes a hole transport layer formed of a metal halide doped with an n-type inorganic compound and in which post-annealing is performed.
Figure 7B:
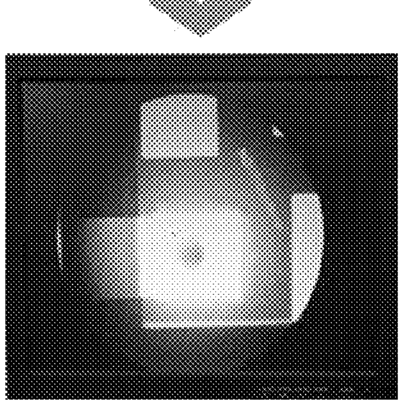

FIG. 7A is photographs showing a change in characteristics a predetermined time after light emission in the light emitting device, which includes the hole transport layer formed of a metal halide doped with an n-type inorganic compound and in which post-annealing is not performed. FIG. 7B is photographs showing a change in characteristics at a predetermined time after light emission in the light emitting device, which includes the hole transport layer formed of a metal halide doped with an n-type inorganic compound and in which post-annealing is performed.

As shown in FIG. 7A, in the light emitting device in which post-annealing was not performed on the hole transport layer including the first and second materials, the light emitting device normally operated in an initial driving state. However, when current was increased by increasing voltage after a predetermined time, luminance tended to decrease. Briefly, driving stability was very low.

In contrast, as shown in FIG. 7B, in the light emitting device in which post-annealing was performed at 200° C. or more on the hole transport layer including the first and second materials, the light emitting device operated normally in an initial driving state, and both current and luminance rose with an increase in voltage even after a predetermined time. Briefly, driving stability was improved compared to FIG. 7A in which post-annealing was not performed on the hole transport layer.

CuI serving as the first material in the light emitting device according to an embodiment of the present disclosure has a wide energy band gap of 3 eV or more, and thus has optically high transmittance compared to a resonant organic hole transport layer material. Further, CuI exhibits p-type semiconductor characteristics and has a valence band maximum (VBM, 5.2 eV) suitable for hole injection and transport of the light emitting device. Moreover, CuI has hole mobility tens to thousands of times higher than that of known organic hole transport layer materials due to low hole effective mass (mh=0.30 m0), vacancy generation in metal, and high carrier concentration thereof.

In the light emitting device according to the present disclosure, the concentration of holes in the hole transport layer can be decreased using a metal halide material such as CuI as the first material and the second material functioning as an n-type semiconductor containing metal cations. Further, generation of a recombination area in the emission layer biased to the interface of the electron transport layer due to very high hole mobility when the hole transport layer is formed of a metal halide alone can be alleviated, and lateral leakage current can be prevented from occurring. Therefore, the hole transport layer including the first material and the second material can be applied to an organic light emitting device including functional layers containing organic materials other than the hole transport layer, and hole mobility can be attained at a predetermined level or more, thus improving electrical characteristics, and it is possible to obtain a light emitting device having transparency through the hole transport layer made of an inorganic semiconductor material.

As confirmed in the light emitting device according to the present disclosure, surface roughness and crystallinity of the hole transport layer can be controlled by doping with the second material in the hole transport layer and post-annealing after forming the hole transport layer, and transparency and stability can be effectively increased through annealing.

Such a metal halide-based hole transport layer is cheaper than a hole transport layer made of a known organic material, is easily obtained, and has superior processing stability.

Further, in the light emitting device according to the present disclosure, the hole transport layer can be formed by vacuum deposition, and functional layers of the light emitting device, including a hole transport layer, an emission layer, an electron transport layer, etc., can be continuously formed in a vacuum chamber. Compared to a known solution process, introduction of foreign substances is easily prevented and thickness control is very advantageous.

Since the present disclosure is based on a vacuum deposition process, which is currently commercialized technology, technology commercialization competitiveness can be effectively increased.

Below is a description of electrical characteristics of the light emitting device including the hole transport layer formed of the material of Experimental Example 6 (CuI+$BiI_3$) and post-annealed at a temperature of 200° C. for 20 minutes.

Figure 8:
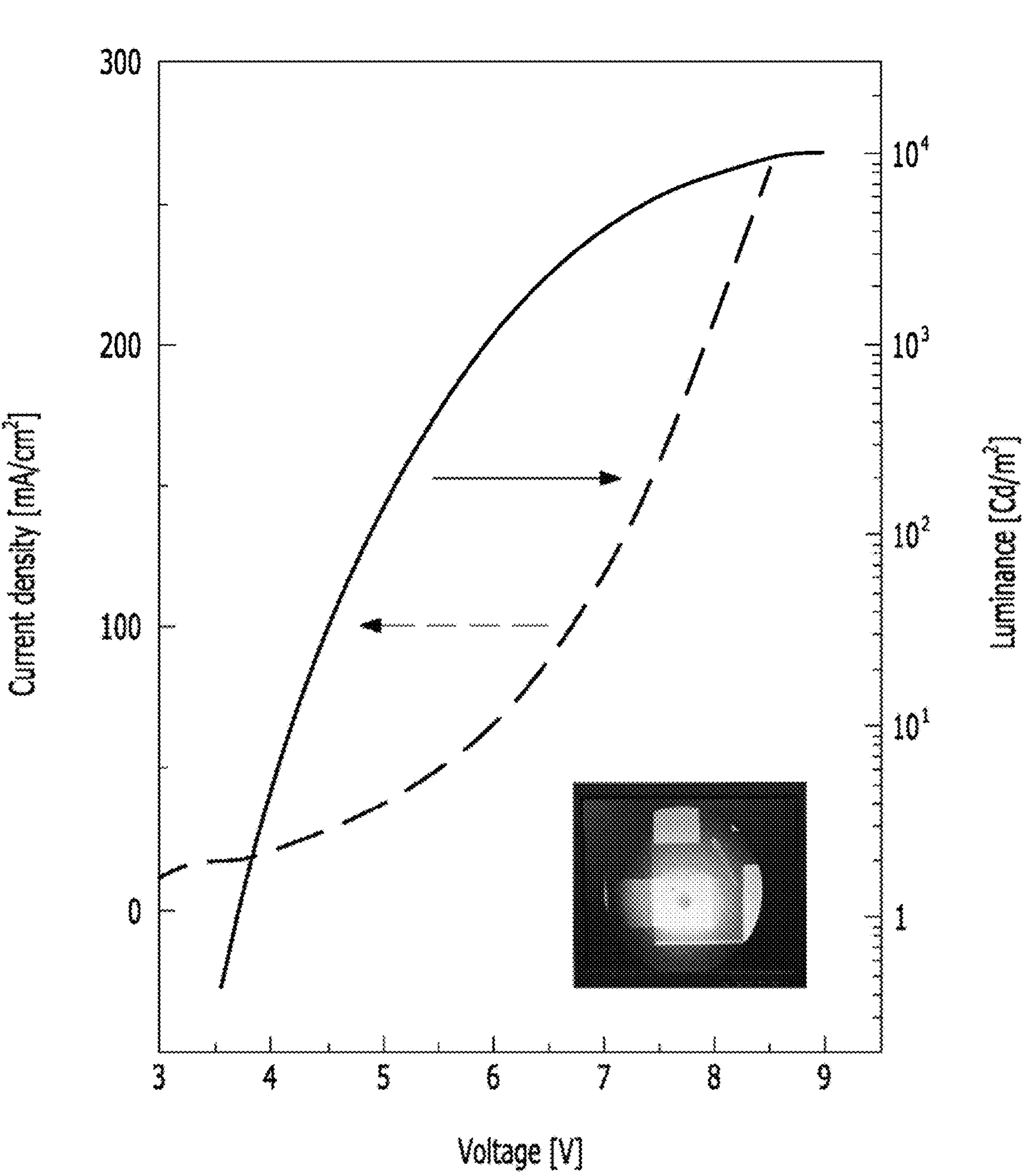
FIG. 8 is a graph showing I-V characteristics and voltage-luminance characteristics of the light emitting device according to the present disclosure.

FIG. 8 is a graph showing I-V characteristics and voltage-luminance characteristics of the light emitting device according to the present disclosure.

Particularly, FIG. 8 shows Experimental Example 6 among Experimental Examples. In forming the hole transport layer, CuI was used as the first material and $BiI_3$ was used as the second material and post-annealing was performed at 200° C. for 20 minutes.

As shown in FIG. 8, the light emitting device according to Experimental Example 6 had a luminance ranging from 0.1 $Cd/m^2$ to $10^4$ $Cd/m^2$ at a driving voltage ranging from 3.5 V to 9 V. Further, as shown in FIG. 2, the light emitting device according to Experimental Example 6 exhibited turn-on characteristics at 3 V or more and a current density of 250 $mA/cm^2$ or more at about 8.5 V or less. The light emitting device manufactured according to the present disclosure is capable of being imparted with high electrical mobility and high luminance in a commercial driving voltage range.

Below is a description of electrical characteristics depending on the thickness of the hole transport layer including the first and second materials according to the present disclosure.

Figure 9:
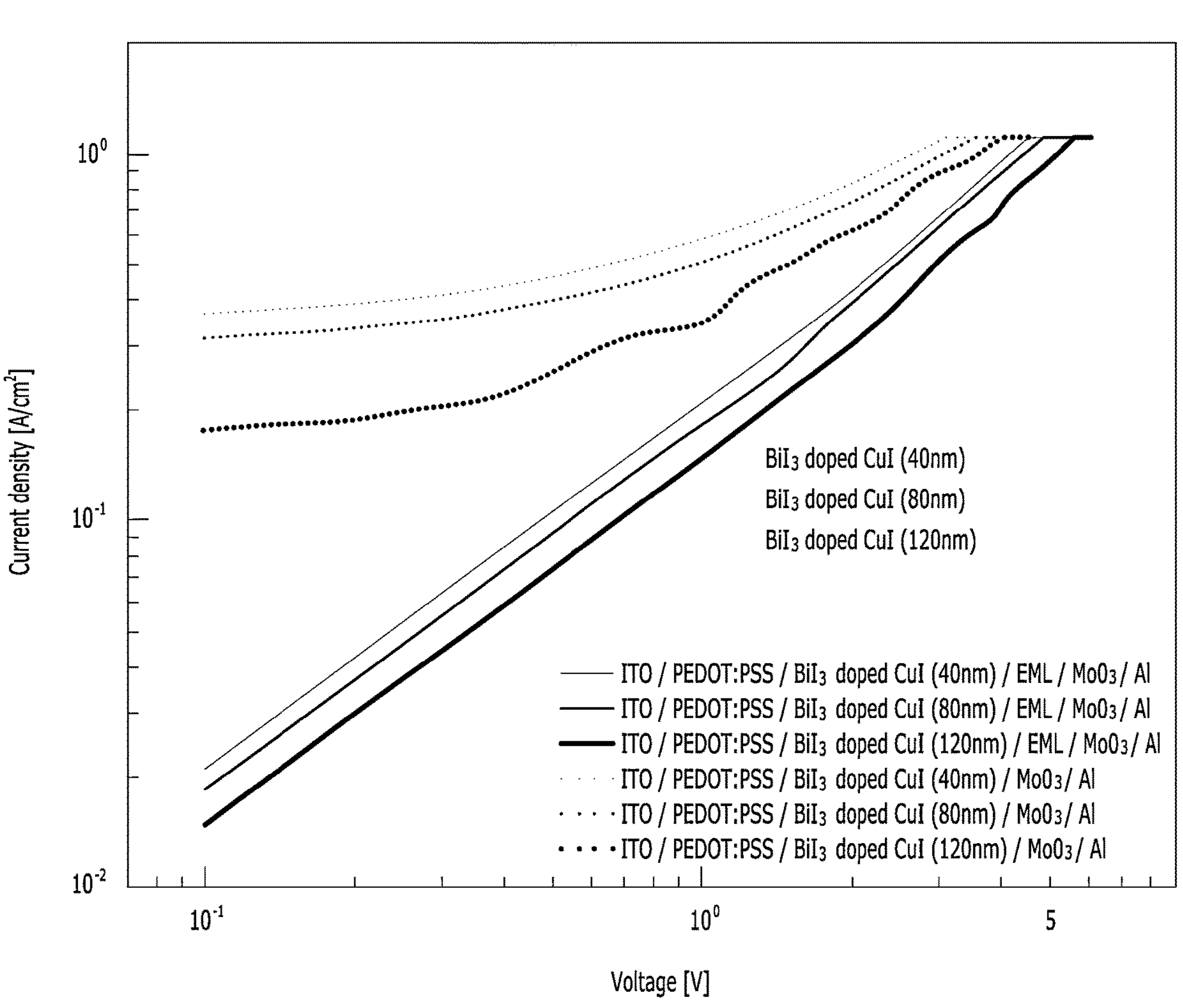
FIG. 9 is a graph showing I-V characteristics depending on the thickness of the hole transport layer of each of Experimental Examples in the light emitting device according to an embodiment of the present disclosure.

FIG. 9 is a graph showing I-V characteristics depending on the thickness of the hole transport layer of each of Experimental Examples in the light emitting device according to an embodiment of the present disclosure.

In the experiment of FIG. 9, the light emitting device was formed in two configurations distinguished by the presence or absence of the emission layer.

The first configuration is a light emitting device without an emission layer, and the electrical characteristics of the device alone are evaluated. This first configuration includes a first electrode made of ITO (indium tin oxide), a hole injection layer made of PEDOT:PSS, a hole transport layer including CuI as the first material and $BiI_3$ as the second material, an electron transport layer made of $MoO_3$, and a second electrode made of aluminum (Al), which are stacked. In the experiment, the emission layer followed the conditions of Experimental Examples above. But embodiments of the present disclosure are not limited thereto. In various embodiments of the present disclosure, the hole injection layer made of PEDOT:PSS and the hole transport layer including CuI as the first material and $BiI_3$ as the second material, can be provided as a combined layer or a single layer.

The second configuration is a light emitting device with an emission layer, and includes a first electrode made of ITO (indium tin oxide), a hole injection layer made of PEDOT:PSS, a hole transport layer including CuI as the first material and $BiI_3$ as the second material, and an emission layer EML, an electron transport layer made of $MoO_3$, and a second electrode made of aluminum (Al), which are stacked. But embodiments of the present disclosure are not limited thereto.

For each of the first configuration and the second configuration, electrical characteristics were measured under a condition that the thickness of the hole transport layer was changed to 40 nm, 80 nm, and 120 nm. But embodiments of the present disclosure are not limited thereto.

Compared to the first configuration without the emission layer, the second configuration with the emission layer showed a relatively low current density by use of driving voltage due to inclusion of the emission layer. However, in both the first configuration and the second configuration, current density rose linearly with an increase in the driving voltage in a similar trend at 1 V or more.

Furthermore, when the thickness of the hole transport layer was increased, resistance was increased and current density was relatively lowered, but in the second configuration including the emission layer, current density increased with a very similar slope in proportion to the driving voltage at different thicknesses. Further, in the second configuration including the emission layer, current density at the same driving voltage was not great for the thickness difference.

The results of FIG. 9 showed that the light emitting device according to the present disclosure includes an emission layer as in the second configuration, and even when the hole transport layer including the first material and the second material is formed to a thickness of 40 nm or more, current density of a predetermined level or higher can be obtained in a commercial driving voltage range. As such, the hole transport layer can be used mainly by adjusting the thickness thereof when emission layers of different colors are applied to the light emitting device for each sub-pixel and when different thicknesses between the first and second electrodes for each emission layer are required, which means that it is possible to apply the hole transport layer at various thicknesses in a commercial driving voltage range.

Further, the results of FIG. 9 showed that, even when the hole transport layer is thicker than the hole injection layer or the emission layer, electro-optical characteristics can be improved upon application of the hole transport layer including the first and second materials.

Below is a description of hole mobility characteristics depending on the concentration of the second material included in the hole transport layer through experiments.

Figure 10:
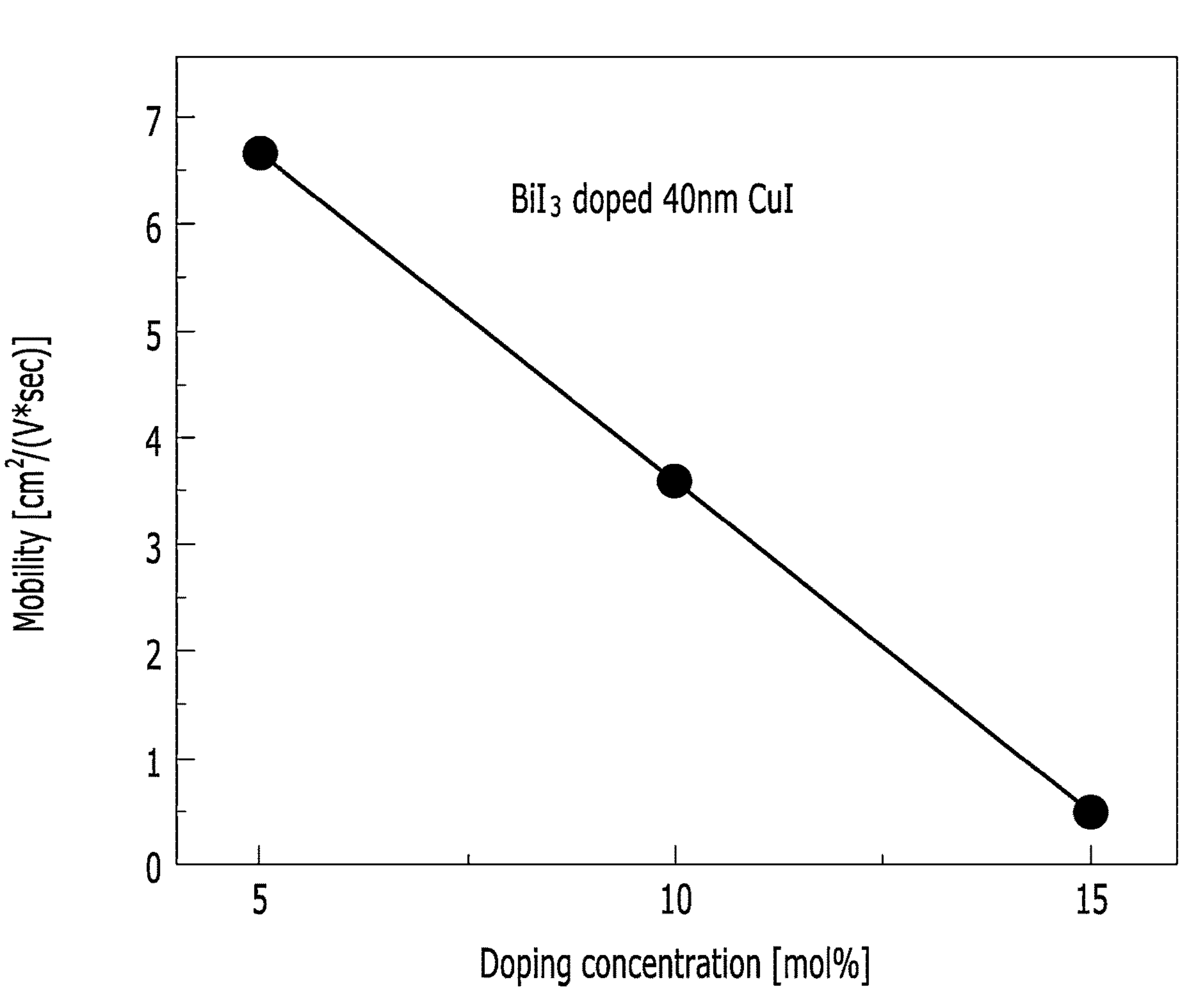
FIG. 10 is a graph showing mobility depending on the doping concentration in the light emitting device according to an embodiment of the present disclosure.

FIG. 10 is a graph showing mobility depending on the doping concentration in the light emitting device according to an embodiment of the present disclosure.

When forming the hole transport layer including the first material of CuI and the second material of $BiI_3$, the second material was included in an amount of each of 5 mol %, 10 mol %, and 15 mol % in the hole transport layer, and hole mobility of the resulting hole transport layer was measured.

Vacuum deposition was performed at a deposition rate of 6.67 $cm^2/V*sec$ for 5 mol % $BiI_3$-doped CuI, at a deposition rate of 3.60 $cm^2/V*sec$ for 10 mol % $BiI_3$-doped CuI, and at a deposition rate of 0.53 $cm^2/V*sec$ for 15 mol % $BiI_3$-doped CuI. But embodiments of the present disclosure are not limited thereto.

As shown in FIG. 10, hole mobility decreased with an increase in the amount of the second material. This is deemed to be because the second material having a polarity opposite to that of the first material serving as the main material functions to lower hole mobility of the first material.

However, even when the second material was included in an amount of 5 mol %, 10 mol %, or 15 mol % in the hole transport layer, the mobility was high compared to a hole transport layer made of a known organic component.

Therefore, in the light emitting device according to the present disclosure, the second material can be included in an amount of 0.1 mol % to 15 mol % in the hole transport layer, thereby ensuring hole mobility of 0.5 $cm^2/V*sec$ or more.

Figure 11:
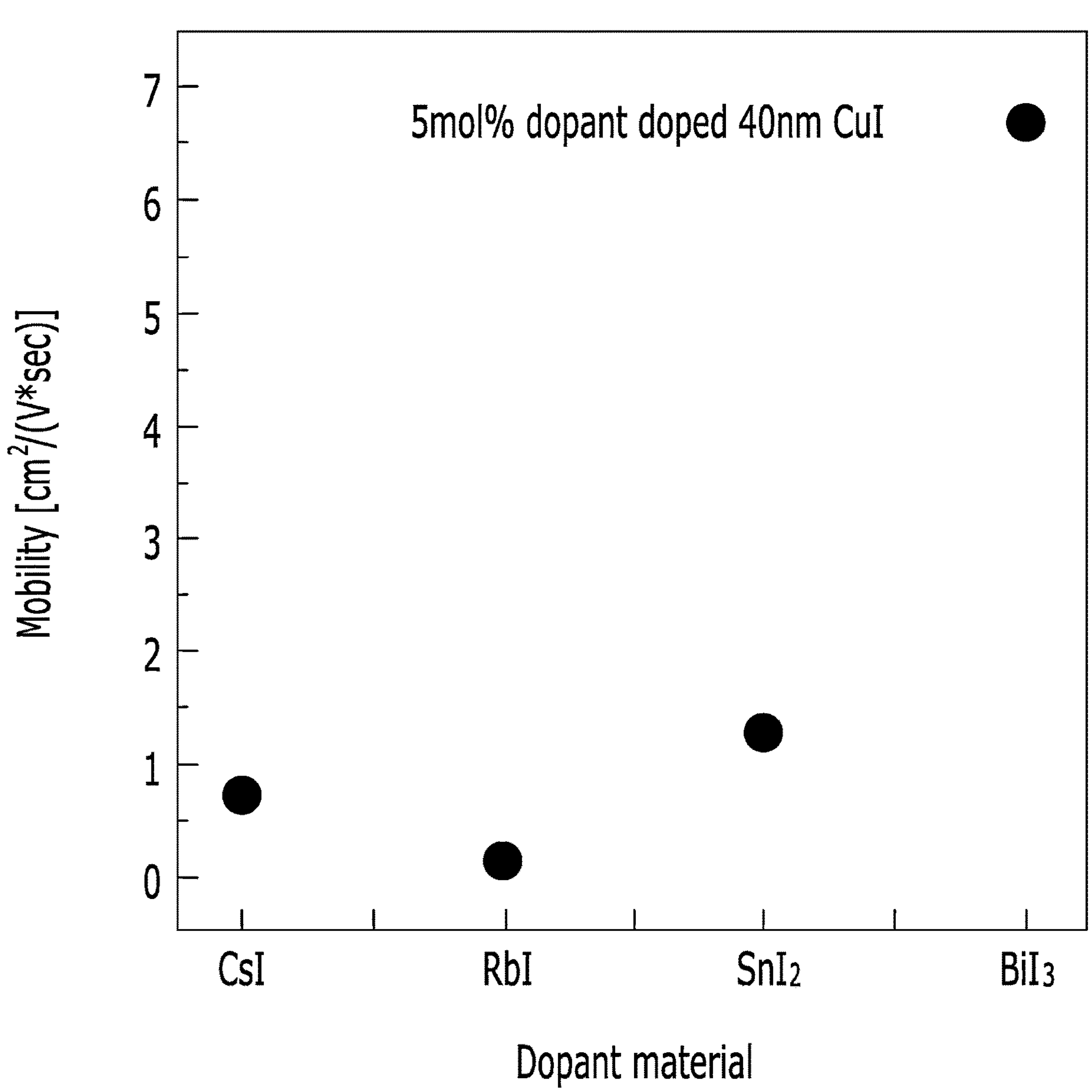
FIG. 11 is a graph showing mobility depending on the kind of n-type inorganic compound of the hole transport layer in the light emitting device according to the present disclosure.

FIG. 11 is a graph showing mobility depending on the kind of n-type inorganic compound for the hole transport layer in the light emitting device according to the present disclosure.

As shown in FIG. 11, mobility was measured using different kinds of second materials (n-type inorganic compounds) included in the hole transport layer. In this experiment, the amount of the second material in the hole transport layer was set to 5 mol %.

For example, mobility gradually decreased in the order of $BiI_3$, $SnI_2$, RbI, and CsI.

Figure 12:
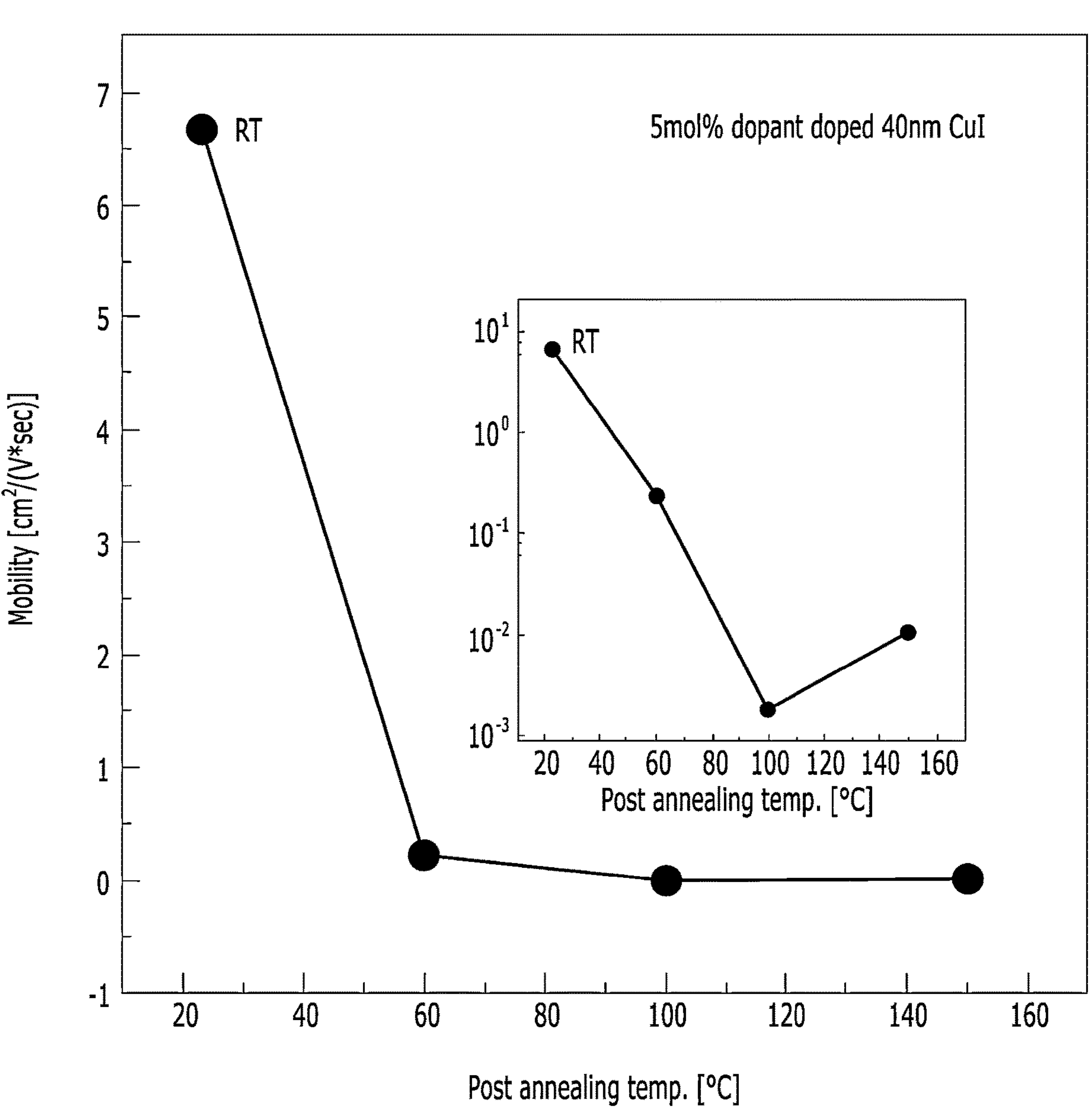
FIG. 12 is a graph showing mobility depending on the post-annealing temperature of the hole transport layer in the light emitting device according to the present disclosure.

FIG. 12 is a graph showing mobility depending on the post-annealing temperature of the hole transport layer in the light emitting device according to the present disclosure.

As shown in FIG. 12, hole mobility of the hole transport layer was measured depending on the post-annealing temperature of the hole transport layer.

In the experiment of FIG. 12, the first material was CuI and the second material was $BiI_3$ in the hole transport layer, and the amount of the second material in the hole transport layer was set to 5 mol %.

As such, mobility was the highest immediately after film formation, and during post-annealing, mobility decreased up to an annealing temperature of 100° C., and mobility increased again when the annealing temperature exceeded 100° C. In the light emitting device according to the present disclosure, hole mobility of $10^{-2}$ $cm^2/V*sec$ or more was obtained through post-annealing at a temperature of 150° C. to 300° C.

In various embodiments of the present disclosure, the first material was CuI and the second material was $BiI_3$ in the hole transport layer, and the amount of the second material in the hole transport layer was set to 5 mol %, but embodiments of the present disclosure are not limited thereto. As previously noted, additional materials can also be added as a third material. In various embodiments, the third material can be one of AgI, CsI, $SnI_2$ and $SnI_2$.

Further, the first material of CuI and the second material of $BiI_3$ in the hole transport layer can be present in separated form. In such instances, the hole transport layer can include a base matrix of CuI with included clusters of $BiI_3$, but embodiments of the present disclosure are not limited thereto. For example, the first material of CuI and the second material of $BiI_3$ can be present in mixed form, so that the hole transport layer can include the first material and the second material in the form of CuBiI, such as $Cu_xBi_yI_z$, where x, y and z are numbers, and where x can be greater than y, and z can be greater than both x and y.

In various embodiments of the present disclosure, the hole transport layer can include an inorganic compound in the form of AxByCz, where A is Cu, B can be one of Bi, Sn, Ag, Cs and Rb, and C is I. In this embodiment, x, y and z are numbers, and x can be greater than y, and z can be greater than both x and y.

Further, the hole transport layer can include a mixture of crystalline and amorphous domains. For example, the hole transport layer can be mostly amorphous, but can have local portions having crystallinity or semi-crystalline form.

Figure 13A:
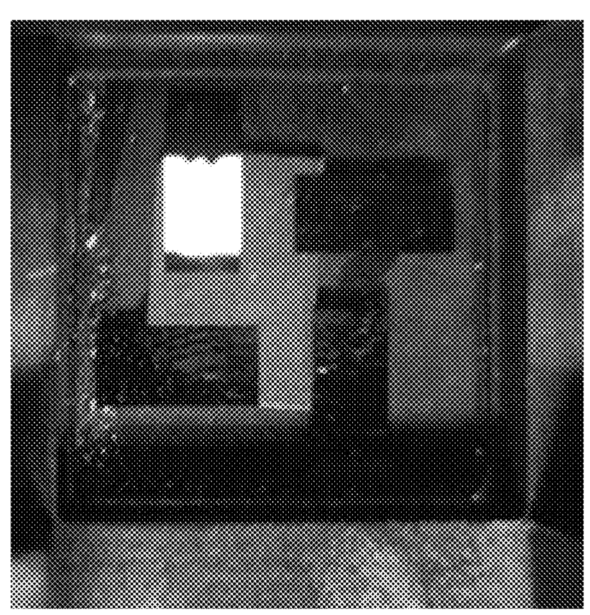
FIGS. 13A and 13B show photographs showing Experimental Example 1 in which the hole transport layer is formed of a metal halide alone and Experimental Example 6 in which the hole transport layer is formed of a metal halide doped with an n-type inorganic compound, respectively.
Figure 13B:
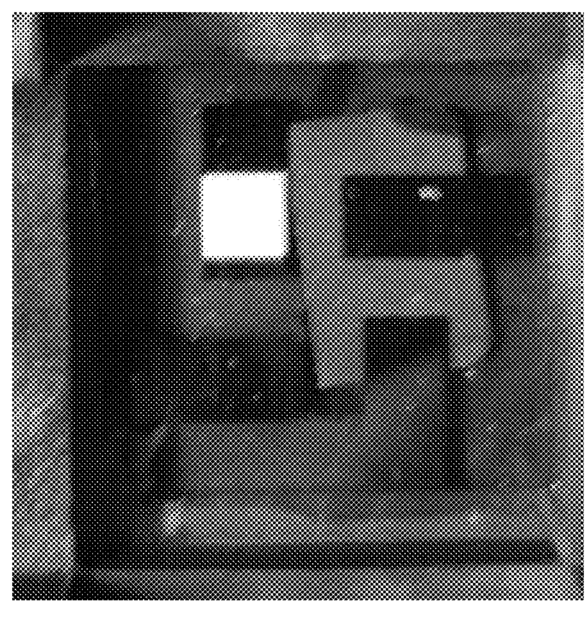

FIGS. 13A and 13B are photographs showing Experimental Example 1 in which the hole transport layer is formed of a metal halide alone and Experimental Example 6 in which the hole transport layer is formed of a metal halide doped with an n-type inorganic compound, respectively.

As shown in FIG. 13A, in Experimental Example 1, after forming the hole transport layer with only the metal halide (first material), hole mobility was very high, so that light emission occurred in the adjacent sub-pixels due to lateral leakage current, but as shown in FIG. 13B, in Experimental Example 6, in which the second material (n-type inorganic compound) was contained as a dopant in the first material, hole mobility was lowered to a level at which lateral leakage current did not occur, confirming that light emission in the adjacent sub-pixels was controlled.

Below is a description of a light emitting device according to another embodiment and a light emitting display device.

Figure 14:
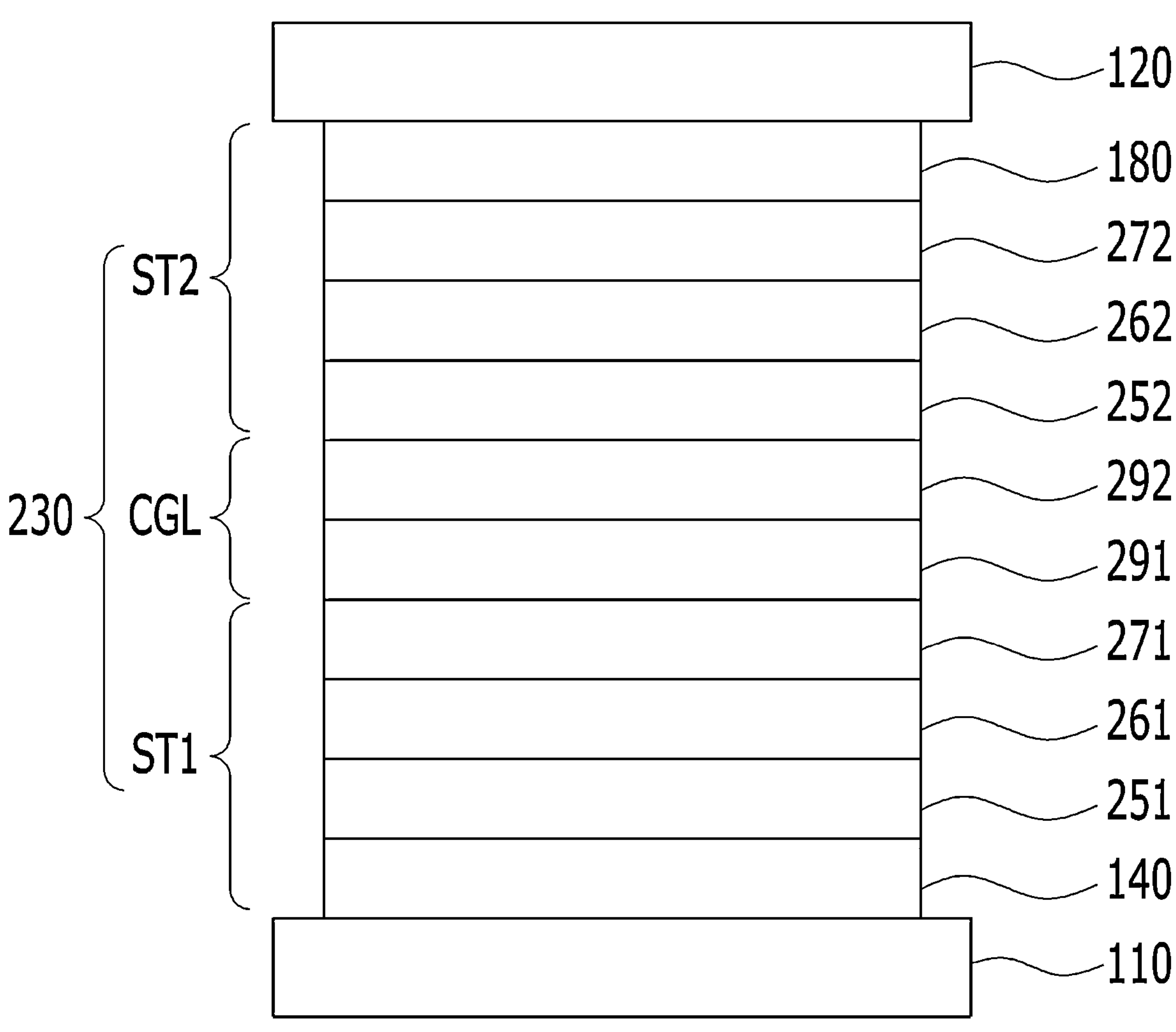
FIG. 14 is a cross-sectional view showing a light emitting device according to another embodiment of the present disclosure.

FIG. 14 is a cross-sectional view showing the light emitting device according to another embodiment of the present disclosure.

As shown in FIG. 14, the light emitting device 200 according to another embodiment of the present disclosure includes a first electrode 110 and a second electrode 120 facing each other, and an intermediate layer 230 interposed between the first electrode 110 and the second electrode 120. The intermediate layer 230 is positioned between the first electrode 110 and the second electrode 120, and includes a first stack ST1 including a first emission layer 261, a second stack ST2 positioned between the first stack ST1 and the second electrode 120 and including a second emission layer 262, and a charge generation layer CGL positioned between the first and second stacks ST1, ST2. The charge generation layer CGL can include an N-type charge generation layer 291 and a P-type charge generation layer 292. In FIG. 14, each of the first and second stacks ST1, ST2 can further include an additional emission layer in addition to the first emission layer 261 and the second emission layer 262. Referring to FIG. 14, in the light emitting device 200, a first hole injection layer 140, a first hole transport layer 251, a first electron transport layer 271, a second hole transport layer 252, a second electron transport layer 272 and a first electron injection layer 180 can be included. The second hole transport layer 252 can comprise an organic material different from the first hole transport layer 251.

Furthermore, the light emitting device according to another embodiment of the present disclosure can be provided in a tandem configuration in which three or more stacks and two or more charge generation layers are disposed between the first electrode and the second electrode.

Figure 15:
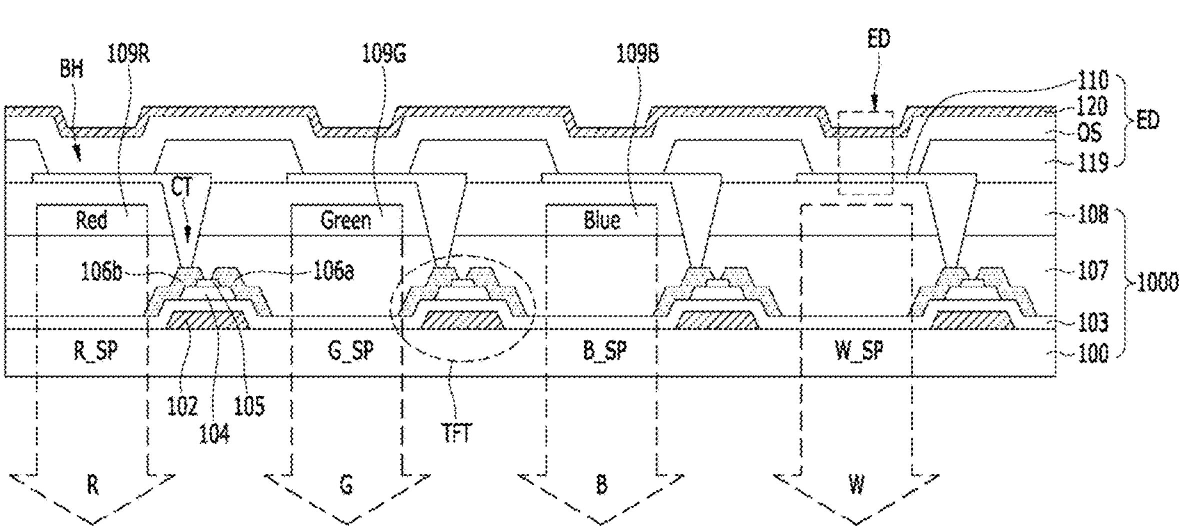
FIG. 15 is a cross-sectional view showing a light emitting display device according to an embodiment of the present disclosure.

FIG. 15 is a cross-sectional view showing a light emitting display device according to an embodiment of the present disclosure.

As shown in FIG. 15, the light emitting display device 2000 according to an embodiment of the present disclosure is capable of emitting white light through the first electrode 110 on the emission side by commonly applying any one selected from among the first to third light emitting devices described above to a plurality of sub-pixels R_SP, G_SP, B_SP, and W_SP.

As shown in FIG. 15, the display device 2000 according to an embodiment of the present disclosure can include a substrate 100 having a plurality of sub-pixels R_SP, G_SP, B_SP, W_SP, a light emitting device ED commonly provided to the substrate 100, a thin film transistor TFT provided to each of the sub-pixels R_SP, G_SP, B_SP, W_SP and connected to the first electrode 110 of the light emitting device ED, and color filters 109R, 109G, 109B provided under the first electrode 110 of at least one of the sub-pixels.

Although FIG. 15 shows an example in which the white sub-pixel W_SP is included in the light emitting display device, the present disclosure is not limited thereto, and a configuration in which the white sub-pixel W_SP is omitted and red, green, and blue sub-pixels R_SP, G_SP, B_SP are provided is possible. In some cases, a combination of cyan, magenta, and yellow sub-pixels capable of representing white color by replacing the red, green and blue sub-pixels is also possible.

The thin film transistor TFT includes a gate electrode 102, a semiconductor layer 104, and a source electrode 106*a* and a drain electrode 106*b* connected to respective sides of the semiconductor layer 104. Further, a channel passivation layer 105 can be further provided on the portion of the semiconductor layer 104 in which the channel is located to prevent direct connection between the source/drain electrodes 106*a*, 106*b* and the semiconductor layer 104.

A gate insulating film 103 is provided between the gate electrode 102 and the semiconductor layer 104.

The semiconductor layer 104 can be formed of any one or a combination of two or more selected from among an oxide semiconductor, amorphous silicon, and polycrystalline silicon. But embodiments of the present disclosure are not limited thereto. For example, when the semiconductor layer 104 is formed of an oxide semiconductor, the heating temperature required to form the thin film transistor can be lowered, and thus the substrate 100 has a high degree of freedom in use, and thus application to a flexible display device becomes advantageous.

Further, the drain electrode 106*b* of the thin film transistor TFT can be connected to the first electrode 110 through a contact hole CT formed in first and second passivation films 107, 108.

The first passivation film 107 is primarily provided to protect the thin film transistor TFT, and color filters 109R, 109G, 109B can be provided thereon.

As shown in FIG. 15, when the plurality of sub-pixels includes a red sub-pixel R_SP, a green sub-pixel G_SP, a blue sub-pixel B_SP, and a white sub-pixel W_SP, the color filter is configured such that first to third color filters 109R, 109G, 109B are respectively provided to the remaining sub-pixels R_SP, G_SP, B_SP, except for the white sub-pixel W_SP, whereby white light emitted through the first electrode 110 is passed at each wavelength. Further, the second passivation film 108 is configured to cover the first to third color filters 109R, 109G, 109B and is formed under the first electrode 110. The first electrode 110 is formed on the surface of the second passivation film 108 excluding the contact hole CT and is connected to either the drain electrode 106*b* or the source electrode 106*a* of the thin film transistor TFT, thus receiving an electrical signal by the thin film transistor TFT.

Here, the configuration ranging from the substrate 100 to the thin film transistor TFT, the color filters 109R, 109G, 109B, and the first and second passivation films 107, 108 can be referred to as a thin film transistor array substrate 1000.

The light emitting device ED is formed on the thin film transistor array substrate 1000 including a bank 119 defining an emission portion BH. The light emitting device ED can include a transparent first electrode 110, a reflective second electrode 120 facing the same, and an intermediate layer OS between the first electrode 110 and the second electrode 120.

The intermediate layer OS can include a hole injection layer, a hole transport layer, an emission layer, an electron transport layer, and an electron injection layer as shown in FIG. 1 or can include a configuration of stacks and charge generation layers as shown in FIG. 14.

In at least the light emitting display device according to the present disclosure, the hole transport layer adjacent to the first electrode 110 can be formed using a metal halide as the first material and an n-type inorganic compound as the second material.

A light emitting device according to one or more aspects of the present disclosure can comprise a first electrode and a second electrode facing each other and a hole transport layer, a first emission layer, and an electron transport layer sequentially provided between the first electrode and the second electrode. In the hole transport layer, a first material of a metal halide can be doped with a second material of an n-type inorganic compound.

In a light emitting device according to one or more aspects of the present disclosure, the hole transport layer may not comprise an organic material and the hole transport layer can be amorphous.

In a light emitting device according to one or more aspects of the present disclosure, the first electrode can comprise a transparent electrode, and the second electrode can comprise a reflective electrode. The hole transport layer can have a transmittance of 80% or more in a visible light range.

In a light emitting device according to one or more aspects of the present disclosure, the hole transport layer can have a transmittance of 95% or more at a wavelength of 520 nm or more.

In a light emitting device according to one or more aspects of the present disclosure, the first emission layer can be in contact with the hole transport layer and the first emission layer can comprise an organic compound.

In a light emitting device according to one or more aspects of the present disclosure, the second material can comprise a halogen or an element of a halogen group same as a halogen or an element of a halogen group contained in the first material.

In a light emitting device according to one or more aspects of the present disclosure, the second material can be a compound of a halogen or an element of a halogen group and a metal, and the metal coupled with the halogen or the element of the halogen group can be at least one selected from among an alkali metal, an alkaline earth metal, a transition metal, and a post-transition metal.

In a light emitting device according to one or more aspects of the present disclosure, the second material can be a compound of halogen or an element of the halogen group and at least one selected from among Bi (bismuth), Cs (cesium), Rb (rubidium), Zn (zinc), Ni (nickel), Ga (gallium), Sn (tin), and Sb (antimony). The first material can comprise CuI.

In a light emitting device according to one or more aspects of the present disclosure, the second material can be contained in an amount of 0.1 mol % to 15 mol % in the hole transport layer.

A light emitting device according to one or more aspects of the present disclosure can further comprise a hole injection layer between the first electrode and the hole transport layer and an electron injection layer between the electron transport layer and the second electrode.

A light emitting device according to one or more aspects of the present disclosure, can further comprise a hole injection layer between the first electrode and the hole transport layer; and a charge generation layer and a light emitting stack comprising a second emission layer between the electron transport layer and the second electrode.

In a light emitting device according to one or more aspects of the present disclosure, the light emitting stack can comprise a hole transport common layer between the charge generation layer and the second emission layer and an electron transport common layer on the second emission layer. The hole transport common layer can comprise an organic material different from the hole transport layer.

A light emitting display device according to one or more aspects of the present disclosure can comprise a substrate having a plurality of sub-pixels, a thin film transistor provided to each of the plurality of sub-pixels and a light emitting device comprising a first electrode and a second electrode facing each other and a hole transport layer, a first emission layer, and an electron transport layer sequentially provided between the first electrode and the second electrode. In the hole transport layer, a first material of a metal halide can be doped with a second material of an n-type inorganic compound. The first electrode can be connected to the thin film transistor.

A method of manufacturing a light emitting device according to one or more aspects of the present disclosure can comprise a first step of forming a plurality of first electrodes spaced apart from each other on a substrate, a second step of forming a hole injection layer on an entire surface of the substrate a third step of forming a hole transport layer on the hole injection layer, by co-depositing a first material of a metal halide and a second material of an n-type inorganic compound in a smaller amount than an amount of the first material and a fourth step of sequentially forming an emission layer, an electron transport layer, and a second electrode.

A method of manufacturing a light emitting device In a light emitting device according to one or more aspects of the present disclosure can further comprise a fifth step of annealing the substrate between the third step and the fourth step.

In a method of manufacturing a light emitting device according to one or more aspects of the present disclosure, the fifth step can be performed at 150° C. to 300° C.

As is apparent from the above description, according to the present disclosure, a light emitting device, a light emitting display device including the same, and a method of manufacturing the same have the following effects.

First, the hole transport layer of a light emitting device can be formed of an inorganic material alone, making it possible to overcome the mobility limit due to use of an organic material.

Second, the hole transport layer includes a first material of a metal halide and a second material of an n-type inorganic compound. The second material having a polarity opposite to that of the first material is included in the hole transport layer, thus compensating for a speed difference between a fast supply speed of holes when the first material is used alone in the hole transport layer and a slow supply speed of electrons supplied to the emission layer due to organic materials used for the emission layer and the electron transport layer. Moreover, in the emission layer, generation of the emission area is not biased to a specific portion and the recombination rate of holes and electrons can be improved.

Third, since the hole transport layer is formed by subjecting the first material and the second material to co-deposition by vacuum deposition, an organic solvent is not used for formation of the hole transport layer, and stability and high mobility of the hole transport layer can be maintained.

Fourth, annealing is performed at a predetermined temperature or higher after deposition of the hole transport layer, making it possible to ensure high transmittance and high transparency even when an inorganic semiconductor is used for the hole transport layer of the light emitting device.

Fifth, when the hole transport layer is provided as a common layer in a large-area light emitting display device, high hole mobility of the first material can be adjusted using the second material having opposite polarity, controlling mobility in a horizontal direction and preventing or reducing lateral leakage current.

Sixth, the hole transport layer is made of a metal halide and an n-type inorganic semiconductor material, environmental stability of which has been verified, and driving voltage can be reduced due to improved hole mobility of the hole transport layer. Moreover, the hole transport layer can be formed through a vacuum deposition process like other functional layers. Therefore, it is possible to lower production energy when forming the hole transport layer and also to reduce use of harmful substances. Accordingly, there is exhibited an ESG (environment/social/governance) effect in view of eco-friendliness, low power consumption, and process optimization.

Although the example embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A light emitting device, comprising:
- a first electrode and a second electrode facing each other; and
- a hole transport layer, a first emission layer, and an electron transport layer sequentially provided between the first electrode and the second electrode,
- wherein the hole transport layer includes a first material of a metal halide, and a second material of an n-type inorganic compound as a dopant in the first material.

2. The light emitting device according to claim 1, wherein the hole transport layer does not comprise an organic material, and is amorphous.

3. The light emitting device according to claim 1, wherein the first electrode comprises a transparent electrode, the second electrode comprises a reflective electrode, and the hole transport layer has a transmittance of about 80% or more in a visible light range.

4. The light emitting device according to claim 3, wherein the hole transport layer has a transmittance of about 95% or more at a wavelength of about 520 nm or more.

5. The light emitting device according to claim 2, wherein the first emission layer is in contact with the hole transport layer and comprises an organic compound.

6. The light emitting device according to claim 1, wherein the second material and the first material comprise a same element of a halogen group.

7. The light emitting device according to claim 1, wherein the second material is a compound of an element of a halogen group and a metal, and the metal is at least one selected from among an alkali metal, an alkaline earth metal, a transition metal, and a post-transition metal.

8. The light emitting device according to claim 1, wherein the second material is a compound of an element of a halogen group and at least one selected from among Bi (bismuth), Cs (cesium), Rb (rubidium), Zn (zinc), Ni (nickel), Ga (gallium), Sn (tin), and Sb (antimony), and
- wherein the first material comprises CuI.

9. The light emitting device according to claim 1, wherein the first material is CuI and the second material is $BiI_3$.

10. The light emitting device according to claim 9, wherein a thickness of the hole transport layer is approximately 40 nm.

11. The light emitting device according to claim 1, wherein the second material is contained in an amount of 0.1 mol % to 15 mol % in the hole transport layer.

12. The light emitting device according to claim 1, further comprising a hole injection layer between the first electrode and the hole transport layer, and an electron injection layer between the electron transport layer and the second electrode.

13. The light emitting device according to claim 1, further comprising:
- a hole injection layer between the first electrode and the hole transport layer; and
- a charge generation layer and a light emitting stack between the electron transport layer and the second electrode,
- wherein the light emitting stack includes a second emission layer.

14. The light emitting device according to claim 13, wherein:
- the light emitting stack further comprises a hole transport common layer between the charge generation layer and the second emission layer, and an electron transport common layer on the second emission layer, and
- the hole transport common layer comprises an organic material different from that of the hole transport layer.

15. A light emitting device, comprising:
- a first electrode and a second electrode on the first electrode; and
- a light emitting stack including a hole transport layer, an emission layer, and an electron transport layer, and provided between the first electrode and the second electrode,
- wherein the hole transport layer includes a first metal halide, and a second metal halide as a dopant in the first metal halide.

16. The light emitting device according to claim 15, wherein the first metal halide is CuI and the second metal halide is $BiI_3$.

17. A light emitting display device, comprising:
- the light emitting device of claim 1;
- a substrate having a plurality of sub-pixels; and
- a thin film transistor provided to each of the plurality of sub-pixels,
- wherein the first electrode is connected to the thin film transistor.

18. A method of manufacturing a light emitting device, the method comprising:
- a first operation of forming a plurality of first electrodes spaced apart from each other on a substrate;
- a second operation of forming a hole injection layer on an entire surface of the substrate;
- a third operation of forming a hole transport layer on the hole injection layer, by co-depositing a first material of a metal halide and a second material of an n-type inorganic compound in a smaller amount than an amount of the first material; and a fourth operation of sequentially forming an emission layer, an electron transport layer, and a second electrode.

19. The method according to claim 18, further comprising a fifth operation of annealing the substrate between the third operation and the fourth operation.

20. The method according to claim 19, wherein the fifth operation is performed at about 150° C. to 300° C.

21. The method according to claim 18, wherein the first material is CuI and the second material is $BiI_3$, wherein the second material is contained in an amount of 0.1 mol % to 15 mol % in the hole transport layer, and wherein the hole transport layer is formed to a thickness of approximately 40 nm.

* * * * *